United States Patent
Fitzpatrick et al.

(10) Patent No.: US 11,984,171 B2
(45) Date of Patent: May 14, 2024

(54) SELECTIVE AND DYNAMIC DEPLOYMENT OF ERROR CORRECTION CODE TECHNIQUES IN INTEGRATED CIRCUIT MEMORY DEVICES

(71) Applicant: Micron Technology, Inc., Boise, ID (US)

(72) Inventors: James Fitzpatrick, Laguna Niguel, CA (US); Phong Sy Nguyen, Livermore, CA (US); Dung Viet Nguyen, San Jose, CA (US); Sivagnanam Parthasarathy, Carlsbad, CA (US)

(73) Assignee: Micron Technology, Inc., Boise, ID (US)

( * ) Notice: Subject to any disclaimer, the term of this patent is extended or adjusted under 35 U.S.C. 154(b) by 84 days.

(21) Appl. No.: 17/841,096

(22) Filed: Jun. 15, 2022

(65) Prior Publication Data

US 2023/0012648 A1    Jan. 19, 2023

Related U.S. Application Data

(60) Provisional application No. 63/221,886, filed on Jul. 14, 2021.

(51) Int. Cl.
| | | |
|---|---|---|
| *G11C 7/00* | (2006.01) | |
| *A63B 24/00* | (2006.01) | |
| *G11C 16/26* | (2006.01) | |
| *G11C 16/34* | (2006.01) | |

(52) U.S. Cl.
CPC ...... *G11C 16/3404* (2013.01); *A63B 24/0075* (2013.01); *G11C 16/26* (2013.01); *A63B 2024/0068* (2013.01); *A63B 2024/0093* (2013.01); *A63B 2220/836* (2013.01); *A63B 2230/06* (2013.01)

(58) Field of Classification Search
CPC ... G11C 29/808; G11C 29/785; G11C 29/846; G11C 29/848; H05L 999/99
USPC .............................................. 365/200, 189.15
See application file for complete search history.

(56) References Cited

U.S. PATENT DOCUMENTS

| | | | |
|---|---|---|---|
| 10,002,042 B2 * | 6/2018 | Alrod | ................... G06F 3/0688 |
| 2009/0241008 A1 | 9/2009 | Kim et al. | |
| 2016/0049203 A1 | 2/2016 | Alrod et al. | |

(Continued)

OTHER PUBLICATIONS

International Search Report and Written Opinion, PCT/US2022/036372, dated Oct. 28, 2022.

*Primary Examiner* — Son T Dinh
(74) *Attorney, Agent, or Firm* — Greenberg Traurig

(57) ABSTRACT

A memory system configured to dynamically adjust the amount of redundant information stored in memory cells of a wordline on an integrated circuit die based on a bit error rate. For example, in response to a determination that a bit error rate of the wordline is above a threshold, the memory system can store first data items as independent first codewords of an error correction code technique into a first portion of the memory cells of the wordline, generate second data items as redundant information from the first codewords, and store the second data items in a second portion of the memory cells of the wordline. If the bit error rate is below the threshold, third data items can be stored as independent second codewords of the same length as the first codewords in the memory cells of the wordline.

20 Claims, 24 Drawing Sheets

(56) References Cited

U.S. PATENT DOCUMENTS

| 2019/0189228 A1 | 6/2019 | Lin et al. |
| 2019/0361769 A1 | 11/2019 | Chan et al. |
| 2021/0158861 A1 | 5/2021 | Jeong et al. |

* cited by examiner

SELECTIVE AND DYNAMIC DEPLOYMENT OF ERROR CORRECTION CODE TECHNIQUES IN INTEGRATED CIRCUIT MEMORY DEVICES

RELATED APPLICATIONS

The present application claims priority to Prov. U.S. Pat. App. Ser. No. 63/221,886 filed Jul. 14, 2021, the entire disclosures of which application are hereby incorporated herein by reference.

TECHNICAL FIELD

At least some embodiments disclosed herein relate to memory systems in general, and more particularly, but not limited to techniques to reliability in storing multiple bits of data per memory cell.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
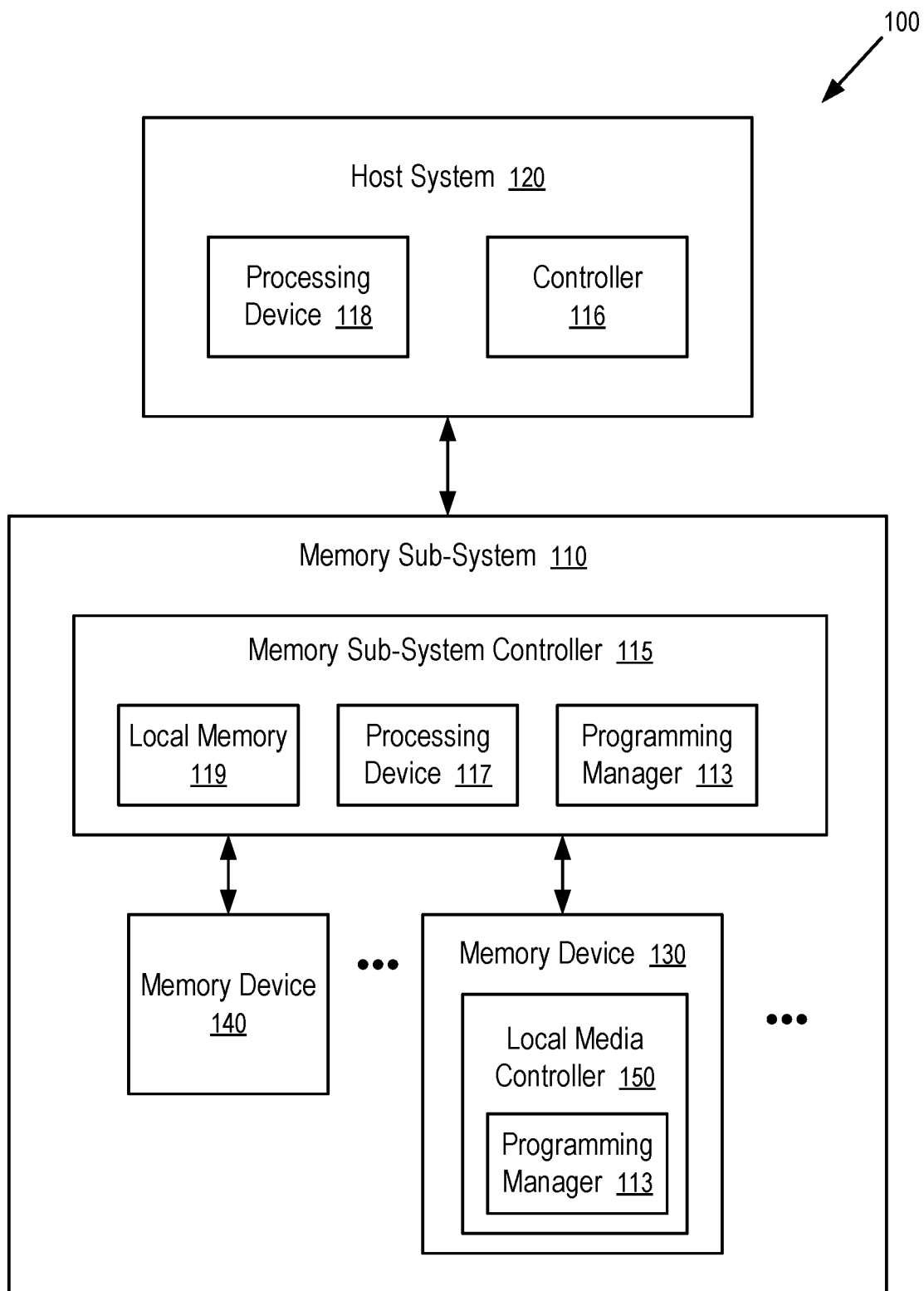
FIG. 1 illustrates an example computing system having a memory sub-system in accordance with some embodiments of the present disclosure.

At least some aspects of the present disclosure are directed to techniques to improve reliability of storing data in memory cells in a memory sub-system. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

Different groups of memory cells in an integrated circuit memory device can have different bit error rates in reading the states of the memory cells and thus the data represented by the states. For example, bit error rates can differ from wordline to wordline, from page type to page type, and/or from die to die. For example, error rate differences can result from variations in manufacturing process, or intrinsic properties of the design or layout of circuits on an integrated circuit die. Certain physical addresses have better error rates, and other addresses have worse. The error rates that dictate reliability consideration are from the worst case stresses the memory device may be subjected to, such as reading and writing at extreme temperatures, or reading after years of being powered off. In general, the worst error rates can be different based on various factors, such as addresses, locations (e.g., wordlines), stress (e.g., operating temperature), usage patterns (e.g., power off periods), etc.

When the integrated circuit memory device is designed to support the storing of sufficient redundant information for each codeword to allow reliable error recovery for the worst performing group of memory cells, the memory device can have unnecessary memory cells configured for high performance groups of memory cells.

At least some aspects of the present disclosure address the above and other deficiencies by designing an integrated circuit memory device that has sufficient support for majority of memory cell groups to recover bit errors by decoding codewords, and dynamically deploying an additional level of error correction technique for memory cell groups that have higher bit error rates to improve error recovery capability.

For example, a memory system can be configured to dynamically adjust the amount of redundant information stored in memory cells of a wordline on an integrated circuit die based on a bit error rate. For example, in response to a determination that a bit error rate of the wordline is above a threshold, the memory system can store first data items as independent first codewords of an error correction code technique into a first portion of the memory cells of the wordline, generate second data items as redundant information from the first codewords, and store the second data items in a second portion of the memory cells of the wordline. If the bit error rate is below the threshold, third data items can be stored as independent second codewords of the same length as the first codewords in the memory cells of the wordline, as further discussed below in connection with FIGS. 13 to 24.

An integrated circuit memory cell (e.g., a flash memory cell) can be programmed to store data by the way of its state at a predefined voltage. For example, if the memory cell is configured/programmed in a state that allows a substantial current to pass the memory cell at the predefined voltage, the memory cell is storing a bit of one; and otherwise, the memory cell is storing a bit of zero. Further, a memory cell can store multiple bits of data by being configured/programmed differently at multiple predefined voltages. For example, the memory cell can store multiple bits of data by having a combination of states at the multiple predefined voltages; and different combinations of the states of the memory cell at the predefined voltages can be interpreted to represent different states of bits of data that is stored in the memory cell.

However, after the states of integrated circuit memory cells are configured/programmed using write operations to store data in the memory cells, the optimized threshold voltage for reading the memory cells can shift due to a number of factors, such as charge loss, read disturb, cross-temperature effect (e.g., write and read at different operating temperatures), etc., especially when a memory cell is programmed to store multiple bits of data.

Data can be encoded with redundant information to facilitate error detection and recovery. When data encoded with redundant information is stored in a memory sub-system, the memory sub-system can detect errors in data retrieved directly from the memory cells in the memory sub-system and/or recover the original data that is used to generate the data for storing in the memory cells. The recovery operation can be successful (or have a high probability of success) when the data retrieved directly from the memory cells in the memory sub-system contains fewer errors, or the bit error rate in the retrieved data is low. For example, error detection and data recovery can be performed using an Error Correction Code (ECC), such as Low-Density Parity-Check (LDPC) code, etc.

It can be desirable in some instances to store a reduced number of bits (e.g., N−1) per memory cell in a memory device that has the circuity to program the threshold voltages of a group of memory cells to store a predetermined number of bits (e.g., N) per memory cell. Adding separate circuity optimized to independently program the threshold voltages of the group of memory cells to store the reduced number of bits per memory cell (e.g., N−1) can lead to increased complexity and/or cost in the hardware of the memory device. Alternatively, an extra group of dummy data (e.g., all zeros, or all ones) can be supplied to increase the number of bits per cell (e.g., to N) to match the functionality of the existing circuity of the memory device in programming threshold voltages. However, storing the extra group of dummy data (e.g., all zeros, or all ones) for the given data having the reduced number of bits per memory cell (e.g., N−1), such that the total number of bits per memory cell is equal to the predetermined number (e.g., N), can lead to reduced reliability in retrieving data from the memory cells, as compared to programming the memory cells at the reduced number of bits (e.g., N−1) per memory cells.

At least some aspects of the present disclosure address the above and other deficiencies by generating the extra group of data from the given data having the reduced number of bits. The extra group of data can be generated to establish a predetermined relation among the groups of data to improve the reliability in retrieving data from the memory cells programmed at the predetermined number of bits per memory cell (e.g., N).

For example, the memory device can be configured to map the values of the predetermined number of bits (e.g., N) to a threshold voltage according to a Gray code (also known as reflected binary code or reflected binary) in programming the threshold voltages of memory cells to store data. The extra group of data can be generated based on an exclusive or (XOR) operation on the reduced number of bits (e.g., N−1). Alternatively, the inverse of the result of XOR (corresponding to XNOR on the reduced number of bits) can be used. Programming the extra group of data with the given data at the predetermined number of bits (e.g., N) per memory cell can result in high reliability in data retrieval.

Different combinations of values of a predetermined number of bits N can be used to represent different numbers from 0 to $2^N-1$. A Gray code is a mapping where one bit and only one bit is changed in the bit values when the number represented by the bit value combination changes to the next larger or smaller number. The threshold voltage of a memory cell can be programmed at one of $2^N$ levels to represent a combination of the values of the predetermined number (N) of bits. Having the threshold voltage of the memory cell programmed at a voltage level is representative of the memory cell storing the combination of values of the N bits corresponding to the voltage level. When a Gray code is used to map between the bit value combinations and the voltage threshold levels, only one bit changes its value when the threshold level moves up or down by one increment. By generating the extra group of data based on XOR/XNOR, the data set to be programmed has either missing odd numbered voltage threshold levels, or even numbered voltage threshold levels. Such an arrangement increases the gap between possible voltage thresholds representing different data and thus improves the reliability in reading data from the memory cells. Further, when one of the predetermined bits stored in a memory cell is found to be corrupted, it can be recovered from the remaining bits through XOR. Thus, the reliability in retrieving data programmed in such a manner is improved.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or such a computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel, a Serial Attached SCSI (SAS) interface, a double data rate (DDR) memory bus interface, a Small Computer System Interface (SCSI), a dual in-line memory module (DIMM) interface (e.g., DIMM socket interface that supports Double Data Rate (DDR)), an Open NAND Flash Interface (ONFI), a Double Data Rate (DDR) interface, a Low Power Double Data Rate (LPDDR) interface, or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (e.g., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (e.g., processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 150) for media management within the same memory device package. An example of a managed memory device is a managed NAND (MNAND) device.

The controller 115 and/or a memory device 130 can include a programming manager 113 configured to program threshold voltages of memory cells to store a predetermined number of bits per memory cell by generating extra data from a dataset that has a reduced number of bits per memory cell. In some embodiments, the controller 115 in the memory sub-system 110 and/or the controller 150 in the memory device 130 can include at least a portion of the programming manager 113. In other embodiments, or in combination, the controller 116 and/or the processing device 118 in the host system 120 includes at least a portion of the programming manager 113. For example, the controller 115, the controller 116, and/or the processing device 118 can include logic circuitry implementing the programming manager 113. For example, the controller 115, or the processing device 118 (e.g., processor) of the host system 120, can be configured to execute instructions stored in memory for performing the operations of the programming manager 113 described herein. In some embodiments, the programming manager 113 is implemented in an integrated circuit chip disposed in the memory sub-system 110. In other embodiments, the programming manager 113 can be part of firmware of the memory sub-system 110, an operating system of the host system 120, a device driver, or an application, or any combination therein.

For example, the programming manager 113 implemented in the controller 115 and/or the controller 150 can receive a reduced number (e.g., N−1) of data groups (e.g., pages) for programming into the memory cells in the memory device 130 that stores a predetermined number (e.g., N) of bits per memory cells. The programming manager 113 generates an extra group (e.g., page) of data by applying an XOR (or XNOR) operation on the reduced number of data groups. A combination of the extra group and the reduced number of groups provides the predetermined number of groups for storing into the group of memory cells. When the memory device 130 has the predetermined number of data groups, the memory device 130 programs threshold voltages of a group of memory cells to store the predetermined number of data groups at the predetermined number of bits per memory cell, using a mapping between the threshold voltage levels and the bit value combinations that is in accordance with a Gray code. As result, the reliability of retrieving data from the memory cells is improved.

Figure 2:
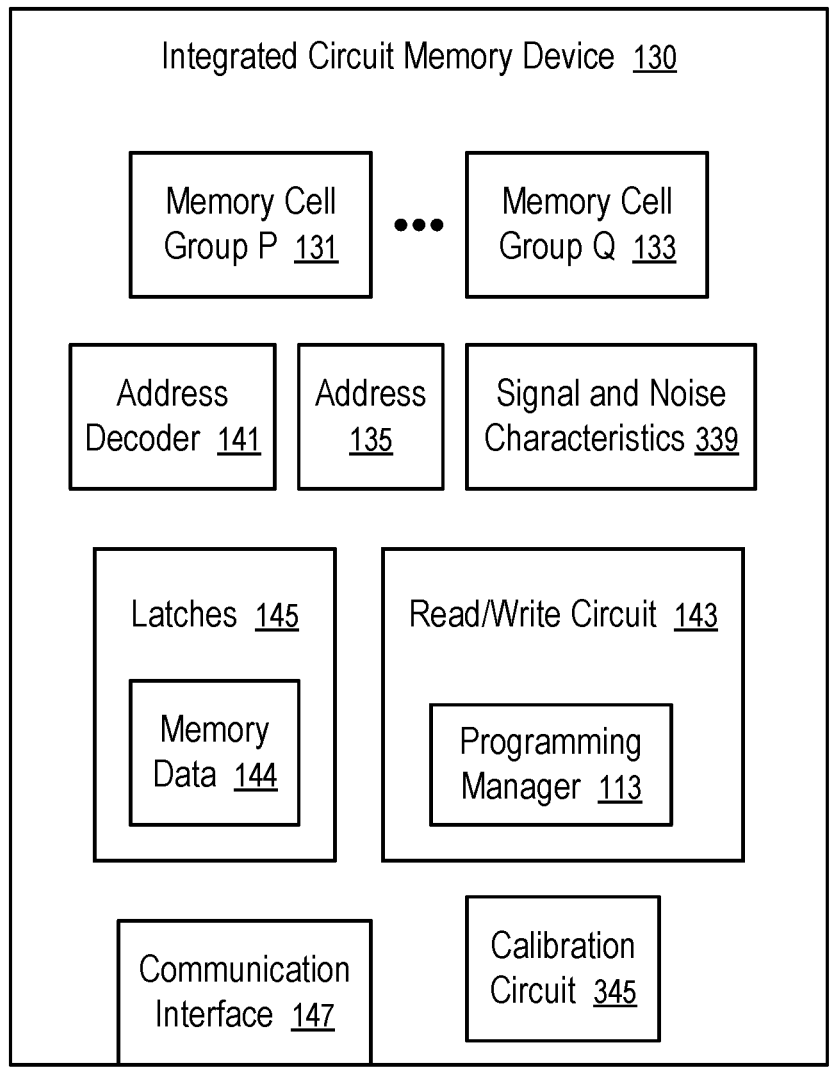
FIG. 2 illustrates an integrated circuit memory device having a programming manager configured to program threshold voltages of memory cells to store data according to one embodiment.

FIG. 2 illustrates an integrated circuit memory device having a programming manager configured to program threshold voltages of memory cells to store data according to one embodiment. For example, the memory devices 130 in the memory sub-system 110 of FIG. 1 can be implemented using the integrated circuit memory device 130 of FIG. 2.

The integrated circuit memory device 130 can be enclosed in a single integrated circuit package. The integrated circuit memory device 130 includes multiple groups 131, . . . , 133 of memory cells that can be formed in one or more integrated circuit dies. A typical memory cell in a group 131 (or group 133) can be programmed to store one or more bits of data.

Some of the memory cells in the integrated circuit memory device 130 can be configured to be operated together for a particular type of operations. For example, memory cells on an integrated circuit die can be organized in planes, blocks, and pages. A plane contains multiple blocks; a block contains multiple pages; and a page can have multiple strings of memory cells. For example, an integrated circuit die can be the smallest unit that can independently execute commands or report status; identical, concurrent operations can be executed in parallel on multiple planes in an integrated circuit die; a block can be the smallest unit to perform an erase operation; and a page can be the smallest unit to perform a data program operation (to write data into memory cells). Each string has its memory cells connected to a common bitline; and the control gates of the memory cells at the same positions in the strings in a block or page are connected to a common wordline. Control signals can be applied to wordlines and bitlines to address the individual memory cells.

The integrated circuit memory device 130 has a communication interface 147 to receive a command having an address 135 from the controller 115 of a memory sub-system 110, retrieve memory data 144 from memory cells identified by the memory address 135, and provide at least the memory data 144 as part of a response to the command. Optionally, the memory device 130 may decode the memory data 144 (e.g., using an error-correcting code (ECC) technique) and provide the decoded data as part of a response to the command. An address decoder 141 of the integrated circuit memory device 130 converts the address 135 into control signals to select a group of memory cells in the integrated circuit memory device 130; and a read/write circuit 143 of the integrated circuit memory device 130 performs operations to determine the memory data 144 stored in the memory cells at the address 135.

The integrated circuit memory device 130 has a set of latches 145 to hold memory data 144 temporarily while the read/write circuit 143 is programming the threshold voltages of a memory cell group (e.g., 131 or 133). For example, the read/write circuit 143 can program the threshold voltages of memory cells in a memory cell group 131 to store N bits per memory cell. The memory cell group (e.g., 131 or 133) has M memory cells. The latches 145 are configured to store N×M bits of data in the form of N data groups. Each of the data group has M bits of data to be stored respectively into M memory cells in the memory cell group (e.g., 131 or 133).

When the latches 145 have N data groups to be stored into a memory cell group (e.g., 131), the programming manager 113 is configured to determine and program threshold voltage levels of memory cells in the memory cell group (e.g., 131). The threshold voltage levels are according to the values of bits in the memory data 144 and a Gray code that maps bit value combinations to threshold levels, such that any two combinations of bit values represented by two successive threshold levels differ by and only by one bit.

Figure 6:
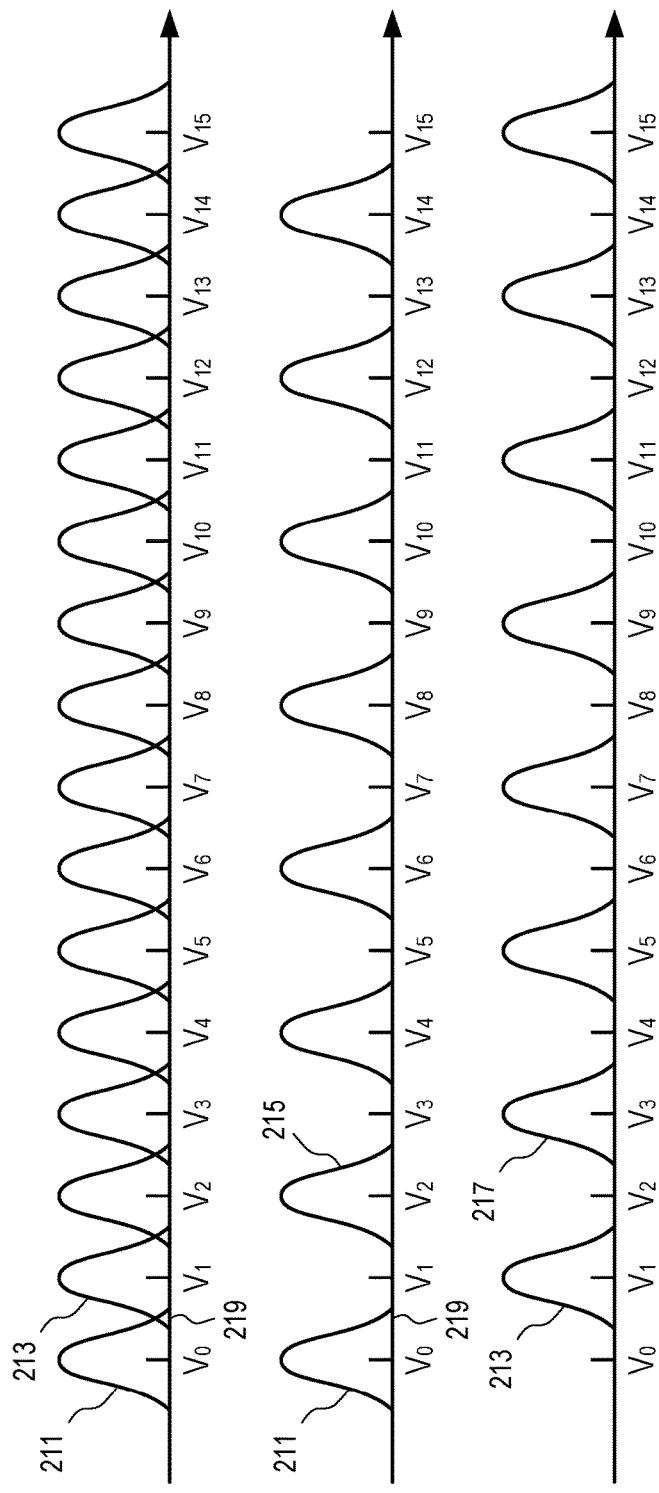
FIG. 6 illustrates reliability improvements in reading data programmed using techniques of FIGS. 4 and 5.

In one embodiment, when the memory device 130 receives N−1 data groups for storing in a memory cell group (e.g., 131), the programming manager 113 generates the Nth data group by applying XOR (or XNOR) on the N−1 data groups. Since the programming manager 113 programs the threshold voltages of the memory cell group (e.g., 131) according to the Gray code, the threshold voltages of the memory cells in the group (e.g., 131) are automatically optimized for high reliability, as illustrated in the example of FIG. 6.

In another embodiment, the programming manager 113 implement in the controller 115 of the memory sub-system 110 is configured to generate the Nth data group such that N groups of data, provided in the latches 145 for storing into the memory cell group (e.g., 131), are related to each other through XOR (or XNOR). In such a scenario, it is not necessary for the read/write circuit 143 to be aware of the generation of the Nth data group, or the relation among the N data groups. The memory device 130 can program the N XOR-related (or XNOR-related) groups of data in the latches 145 in the same way N independent groups of data are programmed. By programming the N data group generated by the controller 115 of the memory sub-system 110 to have the XOR/XNOR relation, the reliability of retrieving data from the memory cell group (e.g., 131) is automatically improved, as illustrated in the example of FIG. 6.

In a further embodiment, a programming manager 113 implemented in the host system 120 is configured to generate the N data groups that are related to each other via XOR or XNOR. When such a set of N data groups is provided into the latches 145 as memory data 144 for programming into a memory cell group (e.g., 131 or 133) according to a Gray code, the reliability of retrieving data from the memory cell group (e.g., 131) is automatically improved.

Figure 3:
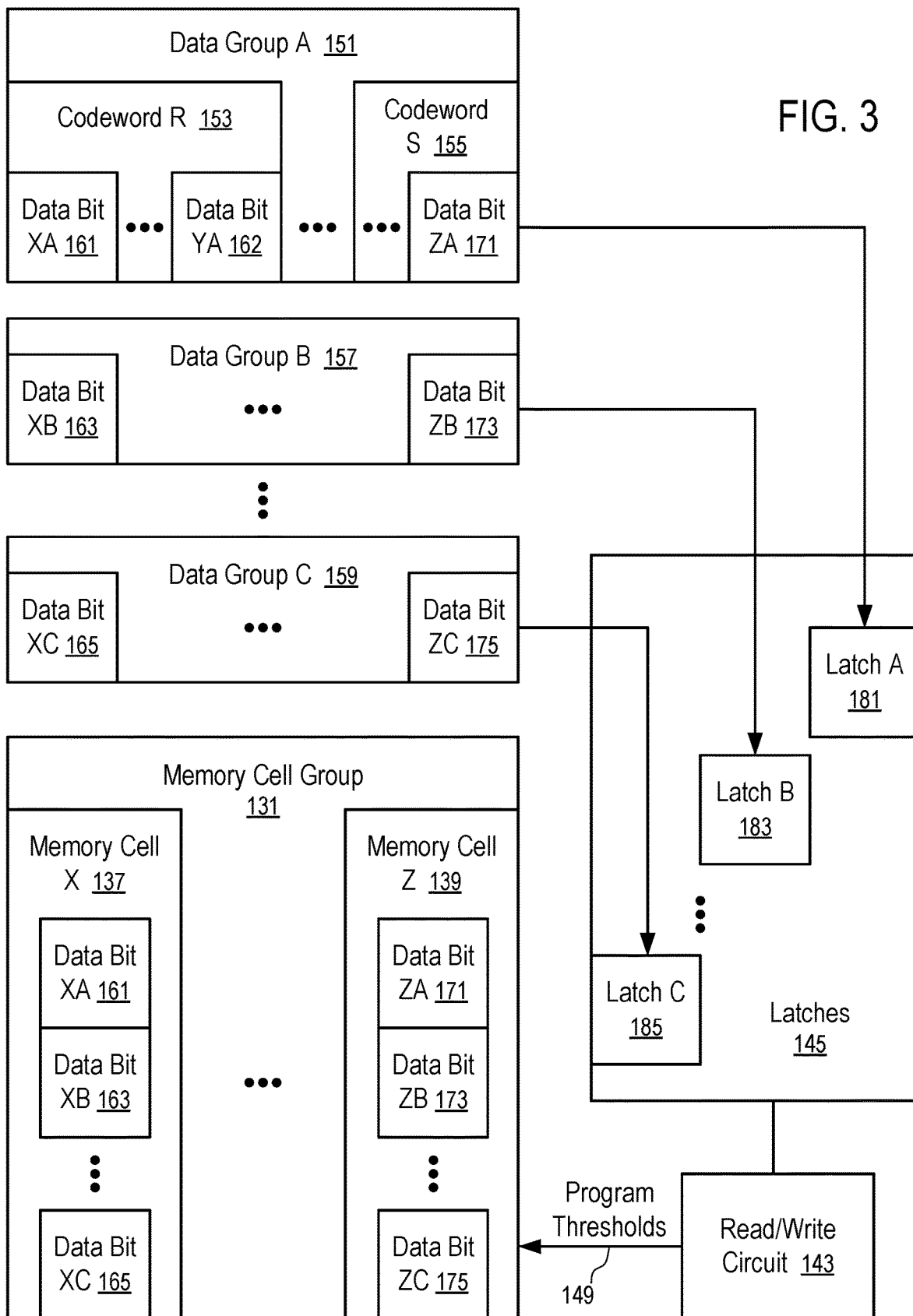
FIG. 3 shows an example of programming memory cells to store multiple bits per memory cell according to one embodiment.

FIG. 3 shows an example of programming memory cells to store multiple bits per memory cell according to one embodiment. For example, the example of FIG. 3 can be implemented in the memory device 130 of FIG. 1 and/or FIG. 2.

In FIG. 3, a memory cell group 131 has memory cells 137, . . . , 139. A number of data groups 151, 157, . . . , 159 provide data bits to be stored into the memory cells 137, . . . , 139. The number of bits provided in each data group (e.g., 157, 159, or 151) equals to the number of memory cells 137 to 139 in the memory cell group 131. Each memory cell (e.g., 139 or 137) stores a set of bits, one from each of the data groups 151, 157, . . . , and 159.

For example, the data bits 161, 163, . . . , 165 from the data groups 151, 157 . . . , 159 are stored into one memory cell 137; and the voltage threshold of the memory cell 137 is programmed by the read/write circuit 143 at a level that represents the values of the data bits 161, 163, . . . , 165. Similarly, the data bits 171, 173, . . . , 175 from the data groups 151, 157 . . . , 159 are stored into another memory cell 139 and represented by the level of the voltage threshold of the memory cell 139.

Optionally, the data bits in a data group can be organized in codeword 153, . . . codeword 155 according to an error detection and data recovery technique, such as Error Correction Code (ECC), Low-Density Parity-Check (LDPC) code, etc.

For example, a codeword 153 in the data group 151 can include data bit 161 to data bit 162. When one of data bit in the codeword 153 is in error, the error can be detected and corrected (e.g., using a technique of Low-Density Parity-Check (LDPC)).

When the data groups 151, 157, . . . , 159 are stored in the latches 181, 183, . . . , 185, the read/write circuit 143 can program 149 thresholds of the memory cells 137, . . . , 139 such that the voltage thresholds of the memory cells 137, . . . , 139 represent the values of the respective data bits from the data groups 151, 157, . . . , 159.

A combination of the values of the data bits (e.g., 161, 163, . . . , 165) to be stored in a memory cell (e.g., 137) is mapped to the level of a voltage threshold of the memory cell (e.g., 137) based on a Gray code. For example, a read/write circuit 143 can include a table of a Gray code (e.g., as illustrated by the table of FIG. 6) to map between the values of a set of bits (e.g., 161, 163, . . . , 165) of a memory cell (e.g., 137) and a threshold level of the memory cell (e.g., 137) that represents the values of the set of bits (e.g., 161, 163, . . . , 165).

When it is desirable to store a reduced number of data groups (e.g., 157 to 159) in the memory cell group 131, an extra data group (e.g., 151) can be computed based on an XOR (or XNOR) operation, such that the reliability of the memory data 144 stored in the memory cells (e.g., 137 to 139) in the form of their programmed voltage thresholds according to a Gray code is automatically improved and/or optimized.

Figure 4:
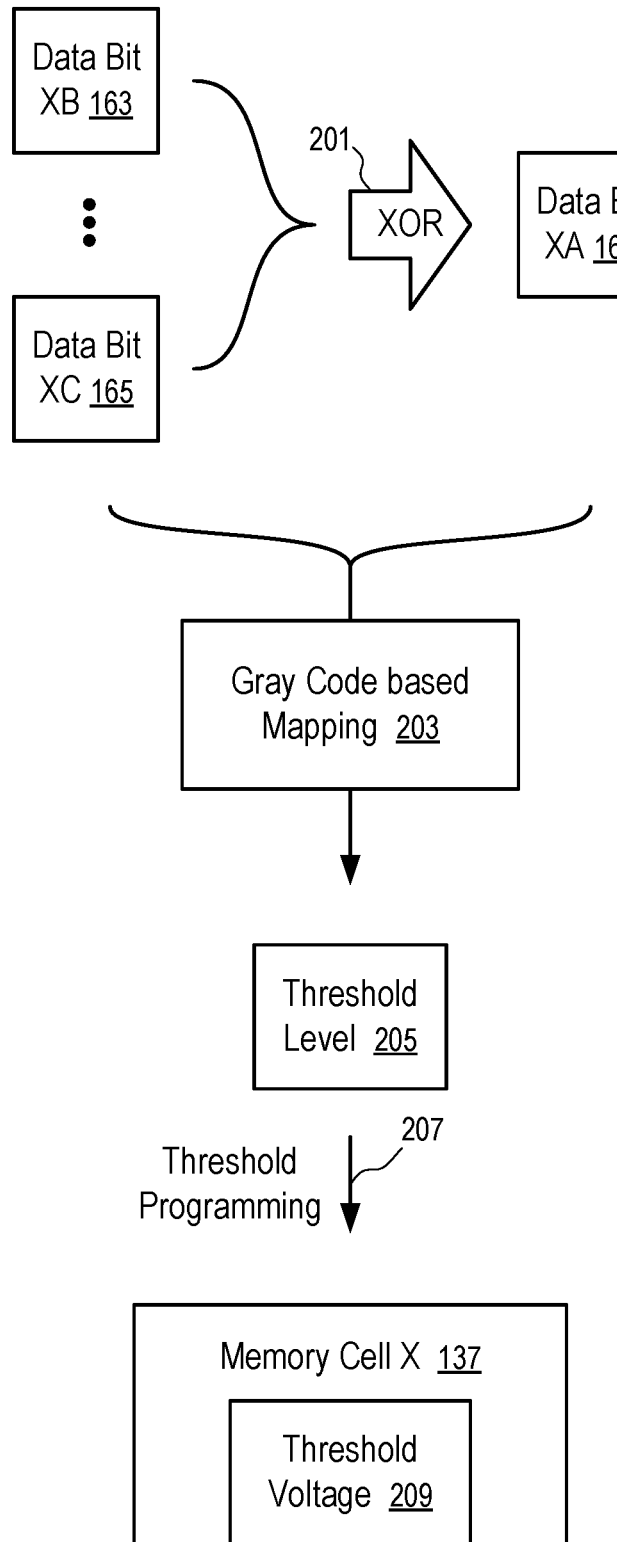
FIGS. 4 and 5 illustrate techniques generate a data group for programming memory cells at threshold levels determined by a Gray code for improved reliability according to some embodiments.
Figure 5:
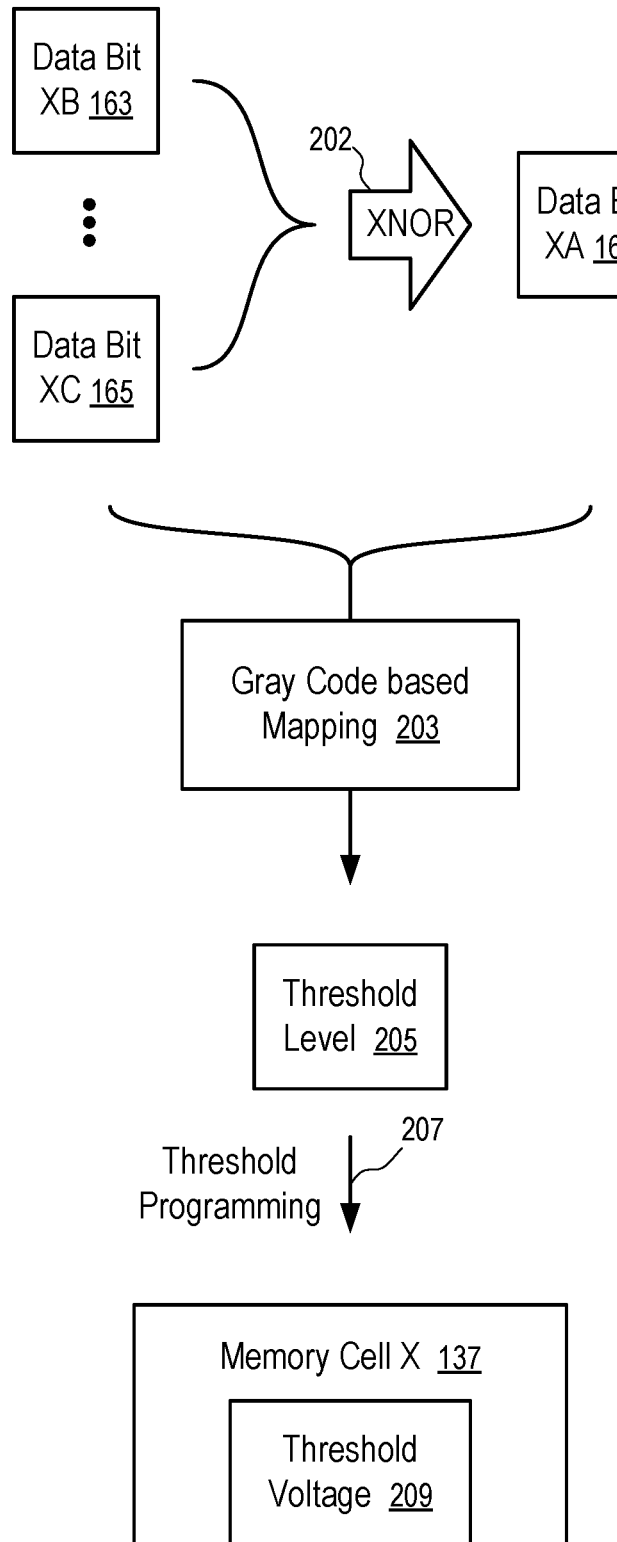

FIGS. 4 and 5 illustrate techniques generate a data group for programming memory cells at threshold levels determined by a Gray code for improved reliability according to some embodiments.

In FIG. 4, data bit 161 is calculated by applying XOR operation 201 to data bits 163 to 165. For example, after computing the result of exclusive or of two of the data bits 163 to 165, an updated result can be obtained from the exclusive or of the result and another of the data bits 163 to 165 until all of the data bits 163 to 165 have participated in the exclusive or computations once. As a result, data bits 161, 163, . . . , 165 form an exclusive or relation, where any of the data bit (e.g., 161 or 163) is equal to the result of applying XOR operation 201 to the other data bits.

For example, to store data groups 157 to 159 into a memory cell group 131 using the read/write circuit 143 of FIG. 3, an extra data group 151 is calculated from the exclusive or of the data groups 151, 157 to 159. Each data bit (e.g., 161) in the data group 151 is obtained by applying XOR operation 201 the corresponding data bits (e.g., 163, . . . , 165) in the given data groups 157, . . . , 159.

As a result, each codeword (e.g., 153) in the data group 151 is also the result of bitwise exclusive or of the corresponding codewords in the given data groups 157, . . . , 159; and the codewords in the data groups 151, 157, . . . , 159 form the exclusive or relation, where any codeword in a data group (e.g., 157) is equal to the exclusive or of the corresponding codeword from the remaining data groups (e.g., 151, 159, . . . ). Such a property/relation can be used to recover a codeword in a data group when the codeword fails to decode in ECC/LDPC operations.

FIG. 4 illustrates an example of using XOR operation 201 to generate an extra data group 151. Similarly, FIG. 5 illustrates another example of using XNOR operation 202 to generate an extra data group 151. The extra data group 151 computed using XNOR operation 202 is equal to the bitwise not of the corresponding data group 151 computed using XNOR operation 202. When the XNOR operation 202 is used to generate the extra data group 151, the codewords in the data groups 151, 157, . . . , 159 form the XNOR relation, where any codeword in a data group (e.g., 157) is equal to the XNOR of the corresponding codeword from the remaining data groups (e.g., 151, 159, . . . ). Such a property/relation can also be used to recover a codeword in a data group when the codeword fails to decode in ECC/LDPC operations.

In FIGS. 4 and 5, the set of data bits 161, 163, . . . , 165 having the XOR or XNOR relation is used in Gray code based mapping 203 to determine threshold level 205 to be programmed for a memory cell 137. After threshold programming 207 of the memory cell 137 to reach the threshold level 205, the memory cell 137 has a threshold voltage 209 that can be detected/tested via the read/write circuit 143; and the values of the data bits 161, 163, . . . , 165 can be determined/inferred from the threshold voltage 209 of the memory cell 137.

The XOR or XNOR relation among the data groups 151, 157, . . . , 159 not only allows the recovery of a failed codeword in a data group from other data groups, but also improves the reliability of determining of the threshold levels (e.g., 205) of the memory cells (e.g., 137) and thus the reading of the memory data 144 represented by the programmed threshold voltages (e.g., 209), as further illustrated in FIG. 6.

FIG. 6 illustrates reliability improvements in reading data programmed using techniques of FIGS. 4 and 5.

FIG. 6 illustrates an example of data programming in a QLC mode where the threshold voltage of a memory cell (e.g., 137) is programmed to represent the values of four bits. A page of memory cells is programmed (written into) together. Since each cell stores four bits, the page of memory cells can store four data pages of data bits, where the number of data bits in a data page is equal to the number of memory cells in a memory cell page. For example, each data page is an example of a data group illustrated in FIG. 3; and the memory cell page is an example of a memory cell group illustrated in FIG. 3.

Conventionally and/or for convenience, the four data pages for a QLC mode are named as lower page (LP), upper page (UP), extra page (XP), and top page (TP) respectively. A memory cell (e.g., 137) stores one bit from each of the four pages. Since the values of the four bits stored in a memory cell (e.g., 137) has 16 different combinations, as illustrated in the table shown in FIG. 6, the threshold voltage 209 of the memory cell (e.g., 137) is programmed to one of 16 threshold levels to represent a corresponding combinations of bit values.

The table shown in FIG. 6 illustrates an example Gray code that maps between the values of the four bits (e.g., 161, 163, . . . , 165) stored in a QLC memory cell (e.g., 137) and the threshold level 205 of the memory cell (e.g., 137). For example, when the memory cell (e.g., 137) is determined to have a threshold level of 0, the memory cell (e.g., 137) is considered to store 1 as the TP bit, 1 as the XP bit, 1 as the UP bit, and 1 as the LP bit. Similarly, to store 0, 1, 1, and 1 as TP, XP, UP and LP bits in the memory cell (e.g., 137), the threshold voltage is programmed to level 1. An increasing threshold level represents an increasing threshold voltage 209 to be programmed for the memory cell (e.g., 137).

A Gray code (e.g., as illustrated in the table of FIG. 6) has the characteristics/propriety where one and only one bit value changes between two successive threshold levels. For example, when threshold level changes from 0 to 1, only the TP bit changes from 1 to 0 in the table of FIG. 6. Similarly, when threshold level changes between 1 and 2 (or, 2 and 3, 3 and 4, 4 and 5, etc.), only the LP bit changes (or, the TP bit, the UP bit, the TP bit, etc. respectively).

In general, different Gray codes can be used to map the combinations of bit values to threshold levels. For example, by inverting the bits in the table of FIG. 6, we obtain an alternative Gray code for mapping bit values to threshold levels. The techniques of the present disclosures are not limited to the use of a particular Gray code.

In generally, after the read/write circuit 143 completes its operation to program the threshold voltage 209 of a memory cell 137 according to a threshold level 205, the threshold voltage 209 of the memory cell 137 may not be at an exact predetermined voltage. After the threshold programming 207, the threshold voltage 209 of the memory cell 137 is most likely at a predetermined voltage, with reduced probability at other voltages away from the predetermined voltage.

For example, when the memory cell 137 is programmed to threshold level 0, the threshold voltage 209 of the memory cell 137 being at the voltage $V_0$ has the highest probability. The probability distribution of the threshold voltage 209 of the memory cell 137 being at voltages near $V_0$ is illustrated by the curve 211.

Similarly, the probability distribution of the threshold voltage 209 of the memory cell 137 being at voltages near $V_1$ when the memory cell 137 is programmed to threshold level 1 is illustrated by the curve 213.

In the voltage region 219, the probability distribution curve 211 and curve 213 overlap with each other, which indicates that when the threshold voltage 209 of the memory cell 137 is found to be within the region 219, there is an ambiguity as to whether the memory cell 137 is programmed at threshold level 0 to represent one set of bit values, or at threshold level 1 to represent another set of bit values. Since the bit values represented by threshold level 0 and threshold level 1 differ by one bit (e.g., TP bit when the Gray code as illustrated in the table of FIG. 6 is used), there is a small probability that this bit, determined based on the threshold voltage of the memory cell 137, is read incorrectly. An error in such a bit can be typically detected and corrected via ECC/LDPC decoding of a codeword (e.g., 153) in a data group (e.g., 151) that contains the bit.

When the TP, XP, UP and LP bits are known to have an XOR relation, the combination of bit values corresponding to threshold level 1 in the table of FIG. 6 is not possible. For example, the combination of bit values corresponding to threshold level 1 does not have the XOR relation and thus is eliminated from a possible data item given for storing in the memory cell 137. Thus, the closest distribution curve 215 to the curve 211 is for threshold level 2 and is better separated from the curve 211 by a wide margin in voltage threshold. This reduces/eliminates the probability of reading error when the threshold voltage of the memory cell 137 is found to be in the voltage region 219.

Similarly, the use of a Gray code and the XOR relation eliminates the combinations of bit values corresponding to other odd numbered threshold levels (e.g., 3, 5, . . . , 15). Thus, the possible distribution curves 211, 215, etc., are well separated for improved data reliability.

Similarly, when the TP, XP, UP and LP bits are configured to have an XNOR relation, the combinations of bit values corresponding to even threshold levels (e.g., 0, 2, . . . , 14) are eliminated. Thus, the possible distribution curves 213, 217, etc., are also well separated for improved data reliability.

Therefore, FIG. 6 shows that, by configuring the TP, XP, UP and LP bits to have an XOR or XNOR relation, the reliability of retrieving the TP, XP, UP and LP bits through the determination of the level of the threshold voltage 209 of the memory cell 137 is improved.

In general, the separation of distribution curves can be achieved with any Gray code for data bits having an XOR relation or an XNOR relation. Thus, the improvement is not limited to the use of a particular Gray code illustrated in the table of FIG. 6. Further, the separation is not limited to QLC memory cells. For example, the technique can be applied to TLC memory cells, or PLC memory cells.

The threshold voltages of memory cells can change due to a number of factors, such as charge loss, read disturb, cross-temperature effect (e.g., write and read at different operating temperatures). Such changes and/or other factors can cause errors in reading the memory cells. Such errors can typically be discovered and/or corrected during the decoding of a codeword using ECC/LDPC techniques. However, when a codeword fails to decode, the XOR relation (or the XNOR relation) can be used to recover the codeword in a way as illustrated in FIG. 7.

Figure 7:
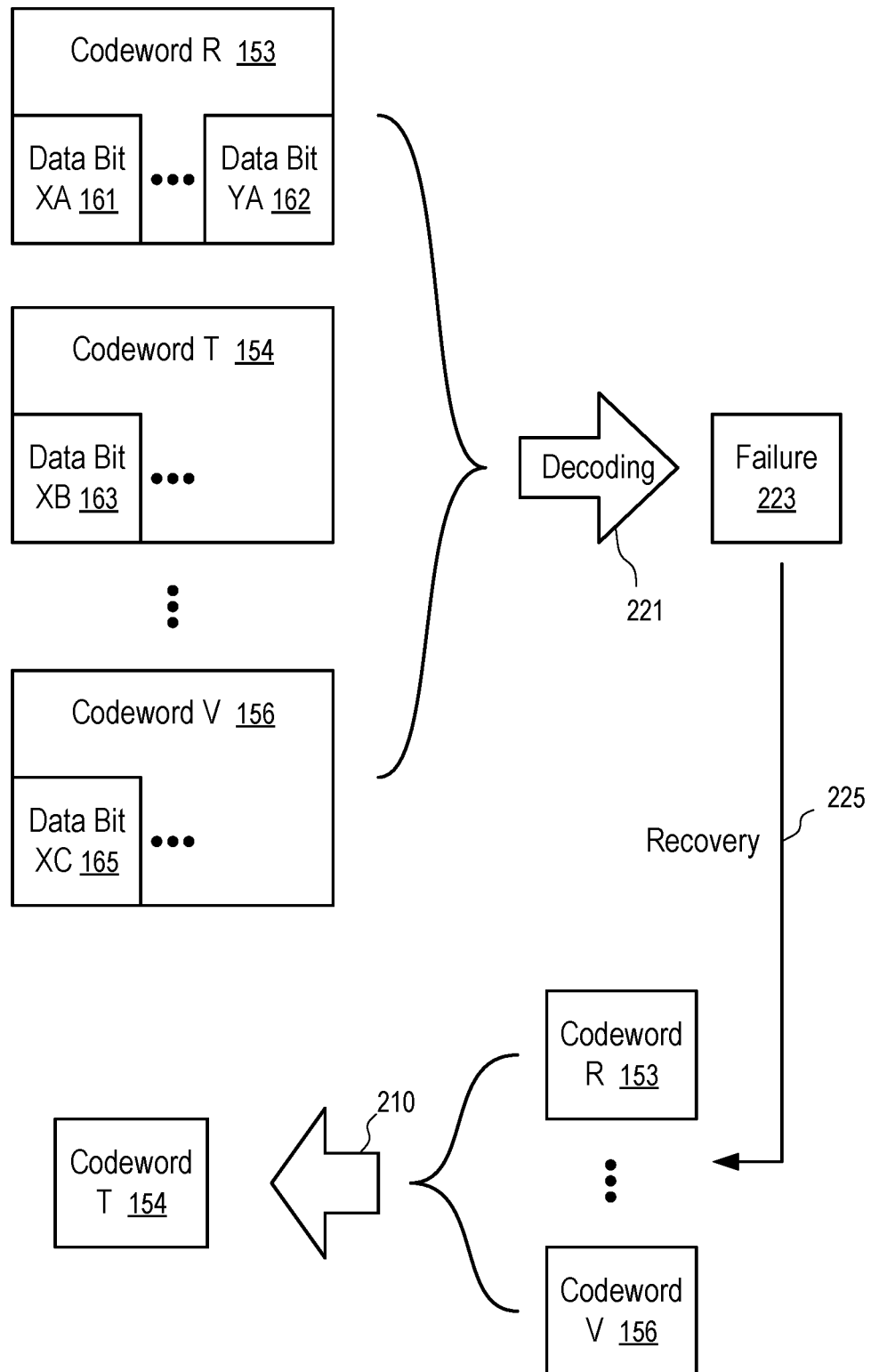
FIG. 7 shows a technique to recover data retrieved from memory cells programmed using the techniques of FIGS. 4 and 5.

FIG. 7 shows a technique to recover data retrieved from memory cells programmed using the techniques of FIGS. 4 and 5.

In FIG. 7, one of the codewords 153, 154, . . . , and 156 can encounter a failure 223 during the operation of decoding 221 using ECC/LDPC techniques, after the codewords are read from the memory cell group 131. For example, a codeword 154 may fail to decode. Since the codewords 153, 154, . . . , 156 correspond to respective codewords in the data groups 151, 157, . . . , 159 that have an XOR (or XNOR) relation, a replacement of the codeword 154 can be found during recovery 225 by applying the corresponding operation 210 (e.g., XOR or XNOR) to the remaining codewords 153 to 156.

In an example, a method is provided to write data into memory cells according to some embodiments. The methods can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method is performed at least in part by the controller 115 of FIG. 1, or processing logic in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the methods can be performed in a memory sub-system 110 illustrated in FIG. 1 using an integrated circuit memory device 130 of FIG. 2 with data programming techniques of FIGS. 3 to 7.

In the method, first groups (e.g., 157, . . . , 159) of data bits (e.g., 163, . . . , 173, 165, . . . , 175) are received for storing into a memory cell group (e.g., 131) of a memory device 130. The memory device 130 can program more groups of data bits into the memory cell group (e.g., 131) than the first groups (e.g., 157, . . . , 159).

In the method, a second group (e.g., 151) of data bits (e.g., 161, . . . , 162, . . . , 171) is generated from the first groups (e.g., 157, . . . , 159) to form a plurality of data groups (e.g., 151, 157, . . . , 159). The plurality of data groups (e.g., 151, 157, . . . , 159) includes the first groups (e.g., 157, . . . , 159) and the second group (e.g., 151) and has a predetermined relation among the data groups (e.g., 151, 157, . . . , 159).

For example, the predetermined relation can be an XOR relation such that any of the data groups (e.g., 151, 157, . . . , 159) is equal to the XOR of the remaining groups. Alternatively, the predetermined relation can be an XNOR relation such that any of the data groups (e.g., 151, 157, . . . , 159) is equal to the XNOR of the remaining groups.

Each respective data bit (e.g., 161) in the second group (e.g., 151) can be based on exclusive or (XOR) of a data bit set (e.g., 163, . . . , 165) having a data bit from each of the first groups (e.g., 157, . . . , 159).

For example, the respective data bit (e.g., 161) is equal to, and/or be calculated from, exclusive or (XOR) of data bits (e.g., 163, . . . , 165) in the data bit set having a data bit from each of the first groups (e.g., 157, . . . , 159).

Alternatively, the respective data bit (e.g., 161) is equal to the inverse of exclusive or (XOR) of data bits (e.g., 163, . . . , 165) in the data bit set having a data bit from each of the first groups (e.g., 157, . . . , 159). For example, the respective data bit (e.g., 161) can be computed as the XNOR of the data bits (e.g., 163, . . . , 165) in the data bit set having a data bit from each of the first groups (e.g., 157, . . . , 159).

For example, the second group (e.g., 151) can be generated from bitwise XOR, or bitwise XNOR, of the first groups (e.g., 157, . . . , 159).

In the method, the memory device 130 determines threshold levels (e.g., 205) of a memory cell group (e.g., 131) based on a predetermined mapping between bit value combinations and threshold levels (e.g., as illustrated via the Gray code shown in the table of FIG. 6). Each respective memory cell in the group of memory cells is determined to have a respective threshold level representing a bit value combination with one bit from each of the plurality of data group; and values of data bits represented by any two successive threshold levels in the predetermined mapping differ by and only by one bit, as in a Gray code (also known as a reflected binary code).

In the method, the memory device 130 programs threshold voltages (e.g., 209) of memory cells (e.g., 137) in the memory cell group (e.g., 131) according to the threshold levels (e.g., 205) determined by the predetermined mapping to store the plurality of data groups (e.g., 151, 157, . . . , 159).

For example, by generating the second group (e.g., 151) from three first groups (e.g., 157, . . . , 159), the threshold voltages (e.g., 209) of the memory cells (e.g., 137) in the memory cell group (e.g., 131) can be programmed in a quad-level cell (QLC) mode to store four bits per memory cell with high reliability.

In general, XOR or XNOR can be used to generate an Nth data group from N−1 data groups to store the N data groups in a memory cell group with N bits per memory cell.

As an example, the plurality of data groups can include a third group (e.g., 157) and fourth groups (e.g., 151, 159, . . . ). When the memory data 144 is retrieved from the memory cell group 131 based on testing the threshold voltages of memory cells (e.g., 137) in the memory cell group (e.g., 131), the third group (e.g., 157) can include a first codeword (154) in the third group (e.g., 157) that fails to decode in an ECC/LDPC decoder. In response, second codewords (e.g., 153, . . . , 156) in the fourth groups (e.g., 151, 159, . . . ) can be used to compute a replacement version of the first codeword (154).

A memory sub-system can have a data integrity classifier configured to determine an error rate classification of data retrieved from memory cells, which allows the memory sub-system to dynamically adjust error detection and recovery operations based on the error rate classification.

An integrated circuit memory cell (e.g., a flash memory cell) can be programmed to store data by the way of its state at a threshold voltage. For example, if the memory cell is configured/programmed in a state that allows a substantial current to pass the memory cell at the threshold voltage, the memory cell is storing a bit of one; and otherwise, the memory cell is storing a bit of zero. Further, a memory cell can store multiple bits of data by being configured/programmed differently at multiple threshold voltages. For example, the memory cell can store multiple bits of data by having a combination of states at the multiple threshold voltages; and different combinations of the states of the memory cell at the threshold voltages can be interpreted to represent different states of bits of data that is stored in the memory cell.

However, after the states of integrated circuit memory cells are configured/programmed using write operations to store data in the memory cells, the optimized threshold voltage for reading the memory cells can shift due to a number of factors, such as charge loss, read disturb, cross-temperature effect (e.g., write and read at different operating temperatures), etc., especially when a memory cell is programmed to store multiple bits of data.

Data can be encoded with redundancy information to facilitate error detection and recovery. When data encoded with redundancy information is stored in a memory sub-system, the memory sub-system can detect errors in raw, encoded data retrieved from the memory sub-system and/or recover the original, non-encoded data that is used to generate encoded data for storing in the memory sub-system. The recovery operation can be successful (or have a high probability of success) when the raw, encoded data retrieved from the memory sub-system contains less than a threshold amount of errors, or the bit error rate in the encoded data is lower than a threshold. For example, error detection and data recovery can be performed using techniques such as Error Correction Code (ECC), Low-Density Parity-Check (LDPC) code, etc.

Some error detection and data recovery operations can be successful in identifying error-free results with the encoded data having a relatively large amount of errors at the cost of a relatively large amount of power consumption and/or a relatively long computing time. Other error detection and data recovery operations can recover a relatively small amount of errors with less power consumption and/or a short computing time.

Conventional calibration circuitry has been used to self-calibrate a memory region in applying read level signals to account for shift of threshold voltages of memory cells within the memory region. During the calibration, the calibration circuitry is configured to apply different test signals to the memory region to count the numbers of memory cells that output a specified data state for the test signals. Based on the counts, the calibration circuitry determines a read level offset value as a response to a calibration command.

At least some aspects of the present disclosure address the above and other deficiencies by dynamically configuring error detection and data recovery operations based on a data integrity classification, or a bit error rate classification, generated from signal and noise characteristics measured by a memory device for memory cells in the memory device.

For example, a predictive model can be generated through machine learning to classify or predict the error rate in the raw data received from a set of memory cells. The classification can be generated by the predictive model based on signal and noise characteristics measured by the memory device during the reading of the raw data from the memory cells in the memory device. When the error rate is classified to be in a low category, the memory sub-system uses a low power ECC decoder and/or skip ECC decoding. When the error rate is classified to be in a high category, the memory sub-system uses a high power ECC decoder. For example, the high power ECC decoder can use not only the hard bit data but also soft bit data in recovering error-free original data being stored in the memory cells. For example, the hard bit data is the encoded data read from the memory cells at optimized, or controller-specified, read voltages; and the soft bit data is the encoded data read at voltages having predetermined offsets from the optimized, or controller-specified read voltages.

For example, counts measured by calibration circuitry and/or its associated data can be used as the signal and noise characteristics for the predictive model. Further, such signal and noise characteristics can be measured for sub-regions in parallel to reduce the total time for measuring the signal and noise characteristics.

The controller 115 can include a data integrity classifier 313 that can use the signal and noise characteristics measured by the memory devices 130 for memory cells to classify, predict, estimate, or determine the degree of error rate in raw data retrieved from the memory cells. In some embodiments, the controller 115 in the memory sub-system 110 includes at least a portion of the data integrity classifier 313. In other embodiments, or in combination, the controller 116 and/or the processing device 118 in the host system 120 includes at least a portion of the data integrity classifier 313. For example, the controller 115, the controller 116, and/or the processing device 118 can include logic circuitry implementing the data integrity classifier 313. For example, the controller 115, or the processing device 118 (processor) of the host system 120, can be configured to execute instructions stored in memory for performing the operations of the data integrity classifier 313 described herein. In some embodiments, the data integrity classifier 313 is implemented in an integrated circuit chip disposed in the memory sub-system 110. In other embodiments, the data integrity classifier 313 can be part of firmware of the memory sub-system 110, an operating system of the host system 120, a device driver, or an application, or any combination therein.

The data integrity classifier 313 can receive signal and noise characteristics measured and provided by a memory device 130 for the memory cells in the memory device 130 and process the signal and noise characteristics to generate a classification that is indicative of the level of errors in the raw data retrieved from memory cells in the memory device 130. Based on the classification, the controller 115 can dynamically adjust the error detection and recovery operations to improve the performance of the memory sub-system 110 (e.g., with reduced power consumption, and/or reduced latency in read operations).

The integrated circuit memory device 130 has a calibration circuit 345 configured to determine measurements of signal and noise characteristics 339 of memory cells in a group (e.g., 131, . . . , or 133) and provide the signal and noise characteristics 339 to the controller 115 of a memory sub-system 110 via the communication interface 147.

In at least some embodiments, the calibration circuit 345 also provides, to the controller 115 via the communication interface 147, the signal and noise characteristics 339 measured to determine the read level offset value. In some embodiments, the read level offset value can be used to understand, quantify, or estimate the signal and noise characteristics 339. In other embodiments, the statistics of memory cells in a group or region that has a particular state at one or more test voltages can be provided as the signal and noise characteristics 339.

For example, the calibration circuit 345 can measure the signal and noise characteristics 339 by reading different responses from the memory cells in a group (e.g., 131, . . . , 133) by varying operating parameters used to read the memory cells, such as the voltage(s) applied during an operation to read data from memory cells.

For example, the calibration circuit 345 can measure the signal and noise characteristics 339 on the fly when executing a command to read the memory data 337 from the address 135. Since the signal and noise characteristics 339 is measured as part of the operation to read the memory data 337 from the address 135, the signal and noise characteristics 339 can be provided from the integrated circuit memory device 130 to the controller 115 with reduced or no penalty on the latency in the execution of the command to read the memory data 337 from the address 135.

The data integrity classifier 313 of the controller 115 of the memory sub-system 110 is configured to use the signal and noise characteristics 339 to generate an error rate classification of the memory data 337.

For example, the data integrity classifier 313 can use a predictive model, trained via machine learning, to predict the likelihood of the memory data 337 retrieved from a memory cell group (e.g., 131 or 133) failing a test of data integrity. For example, when the memory data 337 fails to decode, it fails the test of data integrity. The prediction can be actually made based on the signal and noise characteristics 339. Before the test is made using error-correcting code (ECC) and/or low-density parity-check (LDPC) code, or even before the memory data 337 is transferred to a decoder, the data integrity classifier 313 uses the signal and noise characteristics 339 to predict the result of the test. Based on the predicted result of the test, an optimized operation can be selected and performed for error detection and/or recovery with reduced power consumption and/or latency.

For example, based on the predicted result, one of several conditional paths for the processing of the memory data 337 can be taken.

For example, in one conditional path, when the memory data 337 is classified in a category of likely to fail the test (e.g., for having a high error rate), the memory data 337 can be discarded; and the memory device 130 can be instructed to retry reading the memory data 337 from the address with a further optimized read voltage.

For example, in another conditional path, when the memory data 337 is classified in a category of likely to pass the test (e.g., for having a low error rate), the memory data 337 can be passed to a decoder that uses the hard bit data to provide the original data that is encoded to be stored in the memory device 130.

For example, in further conditional path, when the memory data 337 is classified in a category of likely to need soft bit data to pass the test (e.g., for having a middle error rate), the memory data 337 can be passed to a decoder that uses both the hard bit data and the soft bit data to recover the original data that is encoded to be stored in the memory device 130. If the soft bit data is not already available, the memory device 130 can be instructed to read the soft bit data to supplement the memory data 337 for the decoder.

Thus, when the predictive model predicts a failure, the memory sub-system 110 can initiate the read retry or read calibration without having to wait for the completion of the ECC and/or LDPC operations; and the memory sub-system 110 can skip the transfer of the data to be coded, skip the decoding operation, and/or abort the ongoing decoding operation. As a result, the overall performance of the memory sub-system 110 is improved.

The predictive model can be configured to use the signal and noise characteristics 339 of a memory cell group (e.g., 131 or 133) measured by the calibration circuit 345 during the read operation performed on the memory cell group (e.g., 131 or 133). For example, the predictive model can be pre-trained using data collected from similar memory devices and optionally further trained in the field for the memory sub-system via reinforcement learning based on the results of ECC and/or LDPC operations. For example, when the prediction result is different from the actual test result generated from ECC and/or LDPC operations, a reinforcement learning technique can be applied to train the predictive model to generate a prediction that matches with the actual test result.

Optionally, the predictive model and/or the data integrity classifier 313 can be configured on the memory device 130. When an ECC and/or LDPC failure is predicted, the memory device 130 can suggest read-retry to the controller 115 and predictively initiate the read retry without having to wait for a confirmation from the controller 115. Such a predictive operation to initiate the read retry can reduce the latency of read retry and improve the performance of the memory sub-system 110.

In general, the data integrity classifier 313 can be implemented in the controller 115 and/or the memory devices 130. The prediction generated by the data integrity classifier 313 based on signal and noise characteristics can be used to initiate various processing paths where each path can be configured as an atomic operation. For example, a read-retry can be executed immediately be prior to another command occupying the die in which the memory cell group (e.g., 131 or 133) is formed.

For example, based on the signal and noise characteristics 339, the data integrity classifier 313 can use its predictive model to classify the bit error rate in the retrieved raw memory data 337 as low, medium, or high. If the classified bit error rate is low, the raw memory data 337 can be transferred to an LDPC decoder that operates on hard bit data. Such an LDPC decoder has relatively low complexity and correction capability. In some implementations, multiple decoders can be provided to decode the hard bit data without using soft bit data; the decoders can have different correction capabilities and power consumption; and the classified bit error rate can be further used to select one of the decoders that is likely to be successful in decoding the hard bit data with least power consumption. If the classified bit error rate is medium, the memory device 130 can immediately start to read the soft bit data; and another LDPC decoder that operates on hard bit data and soft bit data can be used.

If the classified bit error rate is high, the memory device 130 can immediately start to read-retry, and/or automatic read calibration with a read of both hard bit data and soft bit data to use an LDPC decoder that has relatively high complexity and correction capability.

In some embodiments, the data integrity classifier 313 generates not only a classification of the bit error rate of the memory data 337 but also a confidence level indicator of the classification being correct. The confidence level indicator can also be used in the selection of a path from multiple conditional processing paths.

Figure 8:
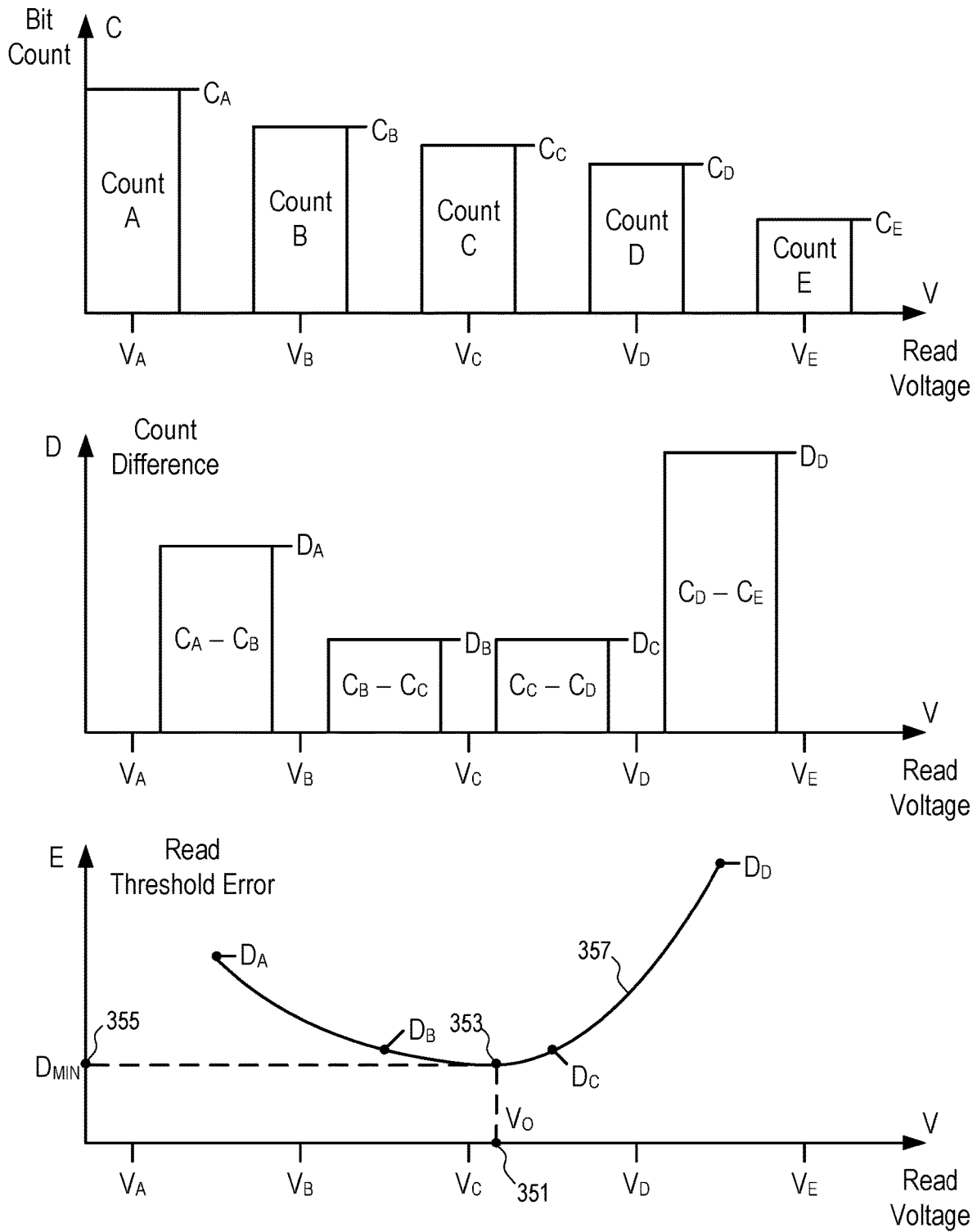
FIG. 8 shows an example of measuring signal and noise characteristics to improve memory operations according to one embodiment.

FIG. 8 shows an example of measuring signal and noise characteristics 339 to improve memory operations according to one embodiment.

In FIG. 8, the calibration circuit 345 applies different read voltages $V_A$, $V_B$, $V_C$, $V_D$, and $V_E$ to read the states of memory cells in a group (e.g., 131, . . . , or 133). In general, more or less read voltages can be used to generate the signal and noise characteristics 339.

As a result of the different voltages applied during the read operation, a same memory cell in the group (e.g., 131, . . . , or 133) may show different states. Thus, the counts $C_A$, $C_B$, $C_C$, $C_D$, and $C_E$ of memory cells having a predetermined state at different read voltages $V_A$, $V_B$, $V_C$, $V_D$, and $V_E$ an be different in general. The predetermined state can be a state of having substantial current passing through the memory cells, or a state of having no substantial current passing through the memory cells. The counts $C_A$, $C_B$, $C_C$, $C_D$, and $C_E$ can be referred to as bit counts.

The calibration circuit 345 can measure the bit counts by applying the read voltages $V_A$, $V_B$, $V_C$, $V_D$, and $V_E$ one at a time on the group (e.g., 131, . . . , or 133) of memory cells.

Alternatively, the group (e.g., 131, . . . , or 133) of memory cells can be configured as multiple subgroups; and the calibration circuit 345 can measure the bit counts of the subgroups in parallel by applying the read voltages $V_A$, $V_B$, $V_C$, $V_D$, and $V_E$. The bit counts of the subgroups are considered as representative of the bit counts in the entire group (e.g., 131, . . . , or 133). Thus, the time duration of obtaining the counts $C_A$, $C_B$, $C_C$, $C_D$, and $C_E$ can be reduced.

In some embodiments, the bit counts $C_A$, $C_B$, $C_C$, $C_D$, and $C_E$ are measured during the execution of a command to read the memory data 337 from the address 135 that is mapped to one or more memory cells in the group (e.g., 131, . . . , or 133). Thus, the controller 115 does not need to send a separate command to request for the signal and noise characteristics 339 that is based on the bit counts $C_A$, $C_B$, $C_C$, $C_D$, and $C_E$.

The differences between the bit counts of the adjacent voltages are indicative of the errors in reading the states of the memory cells in the group (e.g., 131, . . . , or 133).

For example, the count difference $D_A$ is calculated from $C_A$-$C_B$, which is an indication of read threshold error introduced by changing the read voltage from $V_A$ to $V_B$.

Similarly, $D_B=C_B-C_C$; $D_C=C_C-C_D$; and $D_D=C_D-C_E$.

The curve 357, obtained based on the count differences $D_A$, $D_B$, $D_C$, and $D_D$, represents the prediction of read threshold error E as a function of the read voltage. From the curve 357 (and/or the count differences), the optimized read voltage $V_O$ can be calculated as the point 353 that provides the lowest read threshold error $D_{MIN}$ on the curve 357.

In one embodiment, the calibration circuit 345 computes the optimized read voltage $V_O$ and causes the read/write circuit 143 to read the memory data 337 from the address 135 using the optimized read voltage $V_O$.

Alternatively, the calibration circuit 345 can provide, via the communication interface 147 to the controller 115 of the memory sub-system 110, the count differences $D_A$, $D_B$, $D_C$, and $D_D$ and/or the optimized read voltage $V_O$ calculated by the calibration circuit 345.

FIG. 8 illustrates an example of generating a set of statistical data (e.g., bit counts and/or count differences) for reading at an optimized read voltage $V_O$. In general, a group of memory cells can be configured to store more than one bit in a memory cell; and multiple read voltages are used to read the data stored in the memory cells. A set of statistical data can be similarly measured for each of the read voltages to identify the corresponding optimize read voltage, where the test voltages in each set of statistical data are configured in the vicinity of the expected location of the corresponding optimized read voltage. Thus, the signal and noise characteristics 339 measured for a memory cell group (e.g., 131 or 133) can include multiple sets of statistical data measured for the multiple threshold voltages respectively.

For example, the controller 115 can instruct the memory device 130 to perform a read operation by providing an address 135 and at least one read control parameter. For example, the read control parameter can be a suggested read voltage.

The memory device 130 can perform the read operation by determining the states of memory cells at the address 135 at a read voltage and provide the memory data 337 according to the determined states.

During the read operation, the calibration circuit 345 of the memory device 130 generates the signal and noise characteristics 339. The memory data 337 and the signal and noise characteristics 339 are provided from the memory device 130 to the controller 115 as a response. Alternatively, the processing of the signal and noise characteristics 339 can be performed at least in part using logic circuitry configured in the memory device 130. For example, the data integrity classifier 313 can be implemented partially or entirely using the processing logic configured in the memory device 130. For example, the processing logic can be implemented using Complementary metal-oxide-semiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

The signal and noise characteristics 339 can be determined based at least in part on the read control parameter. For example, when the read control parameter is a suggested read voltage for reading the memory cells at the address 135, the calibration circuit 345 can compute the read voltages $V_A$, $V_B$, $V_C$, $V_D$, and $V_E$ that are in the vicinity of the suggested read voltage.

The signal and noise characteristics 339 can include the bit counts $C_A$, $C_B$, $C_C$, $C_D$, and $C_E$. Alternatively, or in combination, the signal and noise characteristics 339 can include the count differences $D_A$, $D_B$, $D_C$, and $D_D$.

Optionally, the calibration circuit 345 uses one method to compute an optimized read voltage $V_O$ from the count differences $D_A$, $D_B$, $D_C$, and $D_D$; and the controller 115 uses another different method to compute the optimized read voltage $V_O$ from the signal and noise characteristics 339 and optionally other data that is not available to the calibration circuit 345.

When the calibration circuit 345 can compute the optimized read voltage $V_O$ from the count differences $D_A$, $D_B$, $D_C$, and $D_D$ generated during the read operation, the signal and noise characteristics can optionally include the optimized read voltage $V_O$. Further, the memory device 130 can use the optimized read voltage $V_O$ in determining the hard bit data in the memory data 337 from the memory cells at the address 135. The soft bit data in the memory data 337 can be obtained by reading the memory cells with read voltages that are a predetermined offset away from the optimized read voltage $V_O$. Alternatively, the memory device 130 uses the controller-specified read voltage provided in the read control parameter in reading the memory data 337.

The controller 115 can be configured with more processing power than the calibration circuit 345 of the integrated circuit memory device 130. Further, the controller 115 can have other signal and noise characteristics applicable to the memory cells in the group (e.g., 131, . . . , or 133). Thus, in general, the controller 115 can compute a more accurate estimation of the optimized read voltage $V_O$ (e.g., for a subsequent read operation, or for a retry of the read operation).

In general, it is not necessary for the calibration circuit 345 to provide the signal and noise characteristics 339 in the form of a distribution of bit counts over a set of read voltages, or in the form of a distribution of count differences over a set of read voltages. For example, the calibration circuit 345 can provide the optimized read voltage $V_O$ calculated by the calibration circuit 345, as signal and noise characteristics 339.

The calibration circuit 345 can be configured to generate the signal and noise characteristics 339 (e.g., the bit counts, or bit count differences) as a byproduct of a read operation. The generation of the signal and noise characteristics 339 can be implemented in the integrated circuit memory device 130 with little or no impact on the latency of the read operation in comparison with a typical read without the generation of the signal and noise characteristics 339. Thus, the calibration circuit 345 can determine signal and noise characteristics 339 efficiently as a byproduct of performing a read operation according to a command from the controller 115 of the memory sub-system 110.

In general, the calculation of the optimized read voltage $V_O$ can be performed within the memory device 130, or by a controller 115 of the memory sub-system 110 that receives the signal and noise characteristics 339 as part of enriched status response from the memory device 130.

Figure 9:
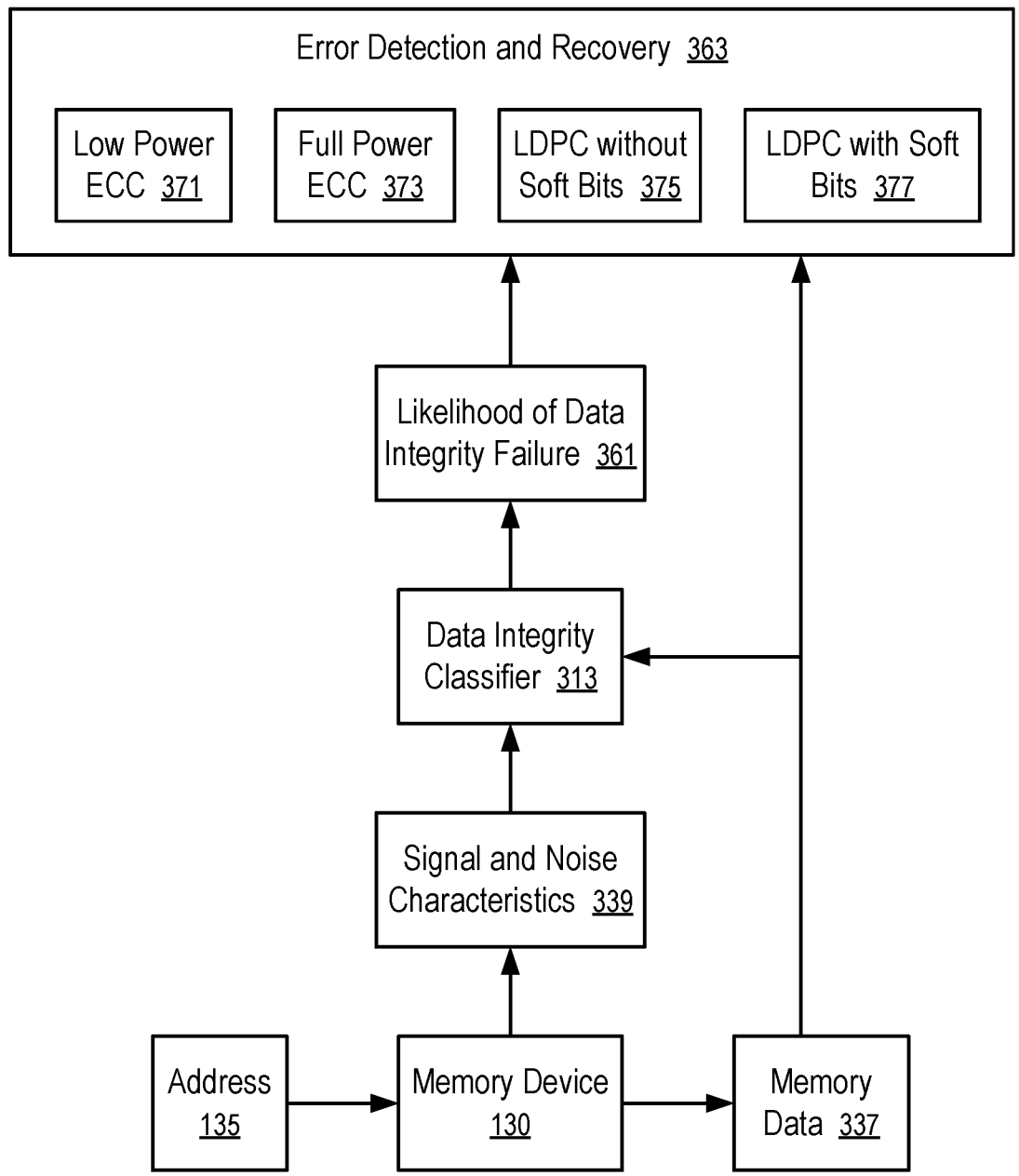
FIG. 9 illustrates a data integrity classifier determining the likelihood of data integrity failure in data retrieved from a memory device to dynamically configure the operations of error detection and recovery for the data according to one embodiment.

FIG. 9 illustrates a data integrity classifier 313 determining the likelihood of data integrity failure in data retrieved from a memory device to dynamically configure the operations of error detection and recovery for the data according to one embodiment. For example, the data integrity classifier 313 can be implemented in the controller 115 of the memory sub-system 110 of FIG. 1, or in an integrated circuit memory device 130 of FIG. 2, using the signal and noise characteristics 339 measured according to FIG. 8.

In FIG. 9, when a memory device 130 receives an address 135 to retrieve memory data 337 from its memory cells, the memory device 130 measures signal and noise characteristics 339 associated with the memory data 337. For example, the calibration circuit 345 of the memory device 130 can generate statistics, such as bit counts, count differences, and/or results derived from the statistics, such as the optimize read voltage, in a way as illustrated in FIG. 8.

The memory data 337 retrieved from the memory cells of the memory device is in an encoded format that allows error detection and recovery 363 (e.g., using techniques such as Error Correction Code (ECC), Low-Density Parity-Check (LDPC) code). The signal and noise characteristics 339 can be provided as input to a data integrity classifier 313 to evaluate the likelihood of the memory data 337 having too many errors for success decoding the memory data 337 by some or all the processing paths/modules/options in error detection and recovery 363.

For example, the memory sub-system 110 can include a low power ECC 371, a full power ECC 373, an LDPC decoder 375 that does not use soft bit data, an LDPC decoder 377 that uses both hard bit data and soft bit data in decoding. In general, available paths/modules/options for decoding the memory data 337 in a memory sub-system 110 are not limited to the examples (e.g., low power ECC 371, full power ECC 373, LDPC decoder 375, LDPC decoder 377) illustrated in FIG. 9; different processing paths/modules/options (e.g., low power ECC 371, full power ECC 373, LDPC decoder 375, LDPC decoder 377) can implemented; and the different processing paths/modules/options have different power consumption levels, different capabilities in recovering error-free original/non-encoded data from the retrieve raw memory data 337, and/or different processing latency.

The data integrity classifier 313 can be trained (e.g., through machine learning) to predict the likelihood 361 of data integrity failure of the memory data 337 based on the associated signal and noise characteristics 339.

For example, the likelihood 361 of data integrity failure of the memory data 337 can be in the form of an estimated bit error rate in the memory data 337.

For example, the likelihood 361 of data integrity failure of the memory data 337 can be in the form of a prediction of whether the memory data 337 can be successfully decoded (e.g., via ECC or LDPC) by any of the processing paths/modules/options and if so, which of the processing paths/modules/options is or are predicted to be able to successfully decode the memory data 337 having the associated signal and noise characteristics 339.

Based on the predicted likelihood 361 of data integrity failure of the memory data 337, the memory sub-system 110 can select one of the processing paths/modules/options with reduced power consumption, reduced processing latency, and/or a high probability of success in decoding.

In some embodiments, the data integrity classifier 313 is trained to directly provide a prediction of an optimized processing path/module to process the encoded memory data 337 retrieved from the memory cells of the memory device 130.

In some embodiments, the data integrity classifier 313 is trained to provide a prediction of a prioritized list of processing paths/modules/options that can successfully decode the encoded memory data 337. Further, the data integrity classifier 313 can further provide an indication of the confidence levels of the selected listed processing paths/modules/options in successfully decoding the memory data 337.

Optionally, the data integrity classifier 313 can also be trained to evaluate the confidence levels of the prediction(s); and the confidence levels can be used in the selection of an option from the available paths/modules/options for the processing of the encoded memory data 337 received from the memory cells in the memory device 130.

In general, the data integrity classifier 313 can be implemented in the memory device 130 and/or in the controller 115 of the memory sub-system 110. For example, one data integrity classifier 313 can be implemented in the memory device 130 and customized for operation decisions to be made in the memory device 130; and another data integrity classifier 313 can be implemented in the controller 115 and customized for operation decisions to be made in the controller 115. For example, the data integrity classifier 313 implemented in the controller 115 can use not only the signal and noise characteristics 339 received from the memory device 130 for the memory data 337 but also other information that may not be available in the memory device 130, such as charge loss, read disturb, cross-temperature effect, program/erase, data retention, etc. For example, the data integrity classifier 313 implemented in the controller 115 and the data integrity classifier 313 implemented in the memory device 130 can have different complexity, and/or different levels of accuracy in their predictions. Optionally, the memory device 130 provides its prediction to the controller 115 as part of enriched status report for retrieving the memory data 337; and the controller 115 uses the prediction generated by the memory device 130 to select a path/module/option for decoding the memory data 337. In some embodiments, the error detection and recovery 363 (or some of the paths/modules/options) are implemented in the memory device 130. For example, the processing logic of the error detection and recovery 363 and the data integrity classifier 313 can be implemented using Complementary metal-oxide-semiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

For example, when the data integrity classifier 313 is implemented in the memory device 130, the output of the data integrity classifier 313 can be used in controlling the retrieval of the memory data 337.

For example, when the output of the data integrity classifier 313 indicates that the encoded memory data 337 is likely to be decoded using a decoder (e.g., 377) that uses soft bit data, the memory device 130 can automatically further read the soft bit data in addition to reading the hard bit data. However, if the data integrity classifier 313 indicates that the encoded memory data 337 can be decoded using a decoder (e.g., 375) that does not require soft bit data as input, the memory device 130 can skip the operations to read soft bit data and/or the operations to transmit the soft bit data to the controller 115.

For example, when the output of the data integrity classifier 313 indicates that none of the available paths/modules/options is likely to be successful in decoding the memory data 337, the memory device 130 can automatically perform a read-retry to search for an improved read voltage without waiting for a command from the controller 115. Further, the memory device 130 can optionally skip reading the memory data 337 when the output of the data integrity classifier 313 indicates that none of the available paths/modules/options is likely to be successful in decoding the memory data 337.

In another example, a method is provided for a memory sub-system 110 to control data integrity operations based on classification of signal and noise characteristics 339 associated with memory data 337 retrieved from memory cells. The method can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method is performed at least in part by the controller 115 of FIG. 1, or processing logic in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method can be implemented in a computing system of FIG. 1 with a memory device of FIG. 2 and signal noise characteristics illustrated in FIG. 8 with the operations illustrated in FIG. 9.

In the method, a processing device (e.g., controller 115) in a memory sub-system 110 transmits a command to a memory device 130 of the memory sub-system 110 to retrieve encoded memory data 337 from an address 135.

For example, memory data 337 can be in an encoded form for storing in the memory cells of the memory device 130 for improved reliability. The encoded memory data 337 has redundancy information, which allows a decoder to detect errors and/or recovery the original data without error when the amount of errors in the retrieved, encoded memory data 337 is no more than a threshold. For example, the data can be encoded/decoded via an error correction code, or a low-density parity-check code.

In the method, in response to the command and during execution of the command in the memory device 130, a calibration circuit 345 of the memory device 130 enclosed in an integrated circuit package measures signal and noise characteristics 339 of a group (e.g., 131 or 133) of memory cells formed on an integrated circuit die.

For example, the calibration circuit 345 is formed at least in part on the integrated circuit die, or another integrated circuit die enclosed in the integrated circuit package.

For example, the signal and noise characteristics 339 can include statistical data of memory cells at varying operating parameters, such as different voltages applied to read memory cells in the group (e.g., 131 or 133).

For example, the statistical data can include bit counts (e.g., $C_A$, $C_B$, $C_C$, $C_D$, and/or $C_E$) of memory cells in the group (e.g., 131 or 133) having a predetermined state when the different voltages (e.g., $V_A$, $V_B$, $V_C$, $V_D$, and/or $V_E$) are applied on the group of memory cells. Alternatively, or in combination, the statistical data can include bit differences (e.g., $D_A$, $D_B$, $D_C$, and/or $D_D$), where each bit difference is a difference between a first bit count (e.g., $C_A$) of memory cells in the group having a predetermined state when a first read voltage (e.g., $V_A$) is applied on the group of memory cells, and a second bit count (e.g., $C_B$) of memory cells in the group having the predetermined state when a second read voltage (e.g., $V_B$) is applied on the group of memory cells.

For example, the predetermined state of a memory cell can be a state where the memory cell is substantially conductive (e.g., having a substantially current passing through the memory cell) when a corresponding read voltage is applied on the memory cell. Alternatively, the predetermined state of a memory cell can be a state where the memory cell is substantially non-conductive (e.g., having no substantially current passing through the memory cell) when a corresponding read voltage is applied on the memory cell.

In the method, a data integrity classifier 313 configured in the memory sub-system 110 generates a prediction based on the signal and noise characteristics 339.

In the method, the memory sub-system 110 selects, based on the prediction, an option from a plurality of options to decode the memory data 337.

For example, the prediction can be based on machine learning to identify a level of bit error rate in the encoded memory data 337, to identify the option, and/or to identify a likelihood of an option of failing or succeeding in decoding the encoded memory data 337 retrieved from the memory device. The prediction can include a confidence level of the prediction.

In the method, the encoded data is decoded using the selected option.

For example, the plurality of options can include decoders having different levels of complexity, taking different inputs, using different amounts of power in decoding, and/or having different amounts of latency in decoding. The plurality of options can include instructing the memory device 130 to retry read at the address 135 without decoding the encoded memory data 337, without transmitting the encoded memory data 337, and/or without reading the memory data 337 from memory cells in the memory device 130.

For example, the plurality of options can include the use of a first decoder and the use of a second decoder that consumes more energy than the first decoder in operation.

The different decoders can use different amounts of data in their decoding operations. For example, the second decoder (e.g., LDPC decoder 377) uses both hard bit data determined from the group of memory cells at read voltages and soft bit data determined from the group of memory cells at voltages having predetermined offsets from the read voltages; and the first decoder (e.g., LDPC decoder 375) uses the hard bit data without using the soft bit data.

Optionally, the calibration circuit 345 is configured to compute the read voltages (e.g., $V_O$) for determination of the hard bit data based on the signal and noise characteristics 339. Alternatively, the read voltages for determination of the hard bit data can be calculated and/or specified by the controller 115 of the memory sub-system 110.

A data integrity classifier 313 can be implemented in the controller 115 of the memory sub-system 110 and/or in the memory device 130.

When a data integrity classifier 313 is implemented in the memory device 130, the memory device 130 can determine whether or not to perform the operations to read the soft bit data based on a prediction generated by its data integrity classifier 313.

When a data integrity classifier 313 is implemented via a processing device 117 of the memory sub-system 110, the memory sub-system 110 can be configured to instruct the memory device 130 to perform a read-retry when the prediction indicates a failure of decoders available in the memory sub-system 110 in decoding the encoded memory data 337, without waiting for the result from a decoder and/or without sending the encoded data to any decoder.

When a data integrity classifier 313 is implemented via a processing device (e.g., controller 115) of the memory sub-system 110, the memory sub-system 110 can be configured to instruct the memory device 130 to provide the soft bit data when the prediction indicates that the second decoder (e.g., processing device 117) is to be used to decode the encoded data.

The data integrity classifier 313 can include instructions configured as software and/or firmware. For example, the processing device 117 can execute the data integrity classifier 313 to perform the above discussed methods.

A non-transitory computer storage medium can be used to store instructions of the firmware of a memory sub-system (e.g., 110). When the instructions are executed by the controller 115 and/or the processing device 117, the instructions cause the controller 115 and/or the processing device 117 to perform the methods discussed above.

Figure 10:
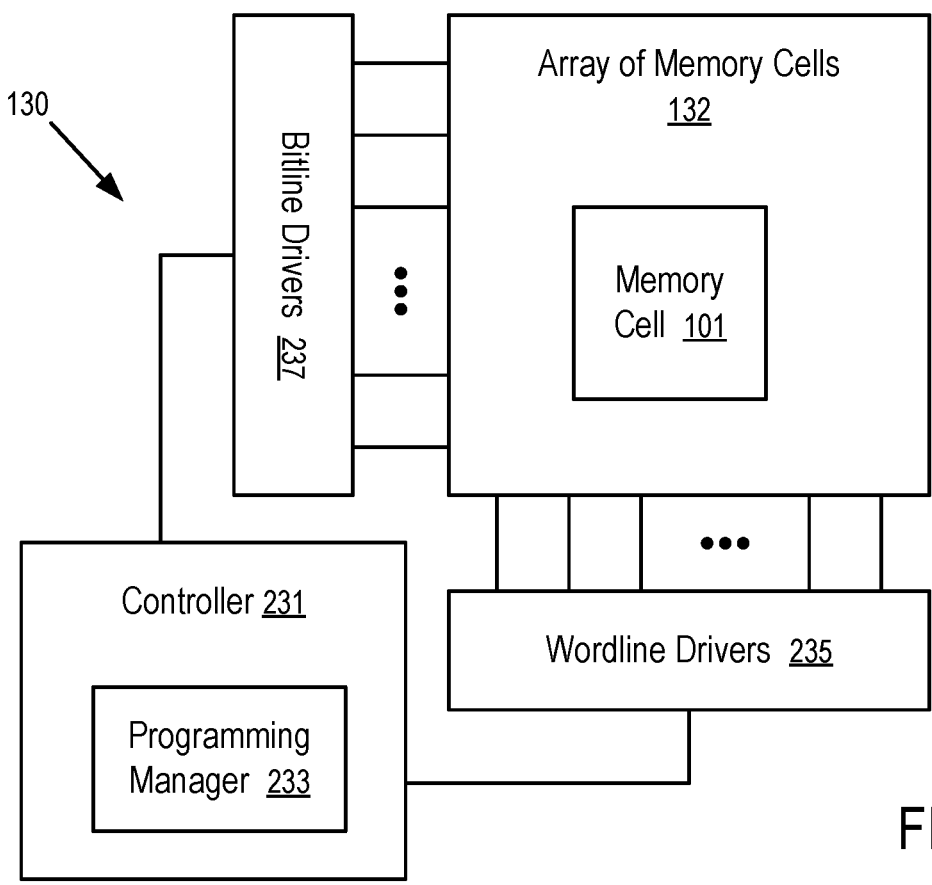
FIG. 10 shows a memory device configured with a programming manager according to one embodiment.

FIG. 10 shows a memory device configured with a programming manager according to one embodiment. For example, the memory device 130 illustrated in FIG. 1 can be implemented using a memory device of FIG. 10 with a cross-point memory; and the local media controller 150 in FIG. 1 can be implemented using the controller 231 in FIG. 10.

In FIG. 10, the memory device 130 includes an array 132 of memory cells, such as a memory cell 101.

The memory device 130 of FIG. 10 includes a controller 231 that operates bitline drivers 237 and wordline drivers 235 to access the individual memory cells (e.g., 101) in the array 132.

Figure 11:
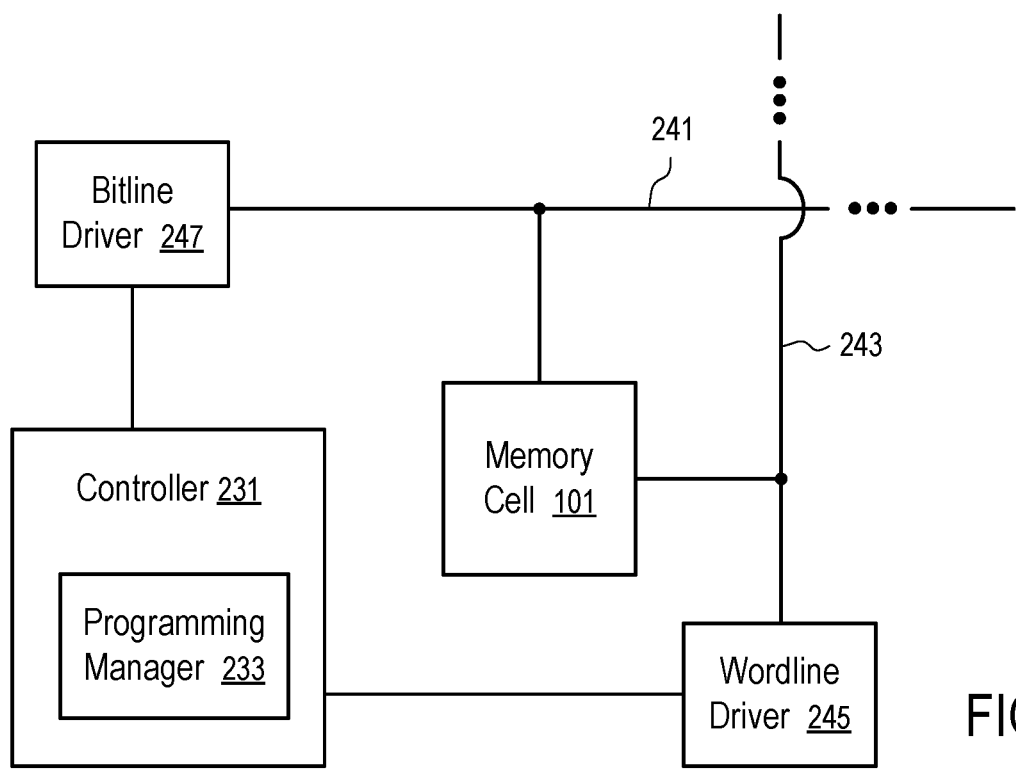
FIG. 11 shows a memory cell with a bitline driver and a wordline driver configured to apply voltage pulses according to one embodiment.

For example, each memory cell (e.g., 101) in the array 132 can be accessed via voltages driven by a pair of a bitline driver 247 and a wordline driver 245, as illustrated in FIG. 11.

The controller 231 includes a programming manager 233. For example, the programming manager 233 can be implemented via logic circuits and/or microcodes/instructions to select, based on parameters about past usages of the array of memory cells, a mode of programming a set of memory cells to store a data item. For example, the usage parameters can include the ratio of read and write operations performed in the array of memory cells, a count of read operations in the array, a count of write operations in the array, a time to the last/previous write operation in the array, etc.

Since memory cells in different locations in the array 132 can have different bit error rates under the same usage, the programming manager 233 can select the programming for the set of memory cells based on attributes of the memory cells in the set, such as a location or address of the memory cell 101 in the memory device, the electrical distance of the memory cell 101 to its voltage drivers, a write timing parameter or its range of the memory cell 101, etc.

FIG. 11 shows a memory cell 101 with a bitline driver 247 and a wordline driver 245 configured to apply voltage pulses according to one embodiment. For example, the memory cell 101 can be a typical memory cell 101 in the memory cell array 132 of FIG. 10.

The bitline driver 247 and the wordline driver 245 of FIG. 11 are controlled by the programming manager 233 of the controller 231 to selectively apply one or more voltages pulses to program the threshold voltage of the memory cell 101 to store data, or to determine the voltage region of the threshold voltage of the memory cell 101 to retrieve the data.

For example, based on a mode selected to program the memory cell 101, the bitline driver 247 and the wordline driver 245 can be instructed or controlled by the programming manager 233 to program the memory cell 101 a single level cell (SLC) mode to store one bit per cell, or program the memory cell 101 in a multi-level cell (MLC) mode to store more than one bit per cell. In some implementations, a typical memory cell 101 can be programmed in a mode to store an average of 1.5 bits per cell; and in other implementations, a typical memory cell 101 can be programmed in a mode to store two or more bits per cell.

The bitline driver 247 and the wordline driver 245 can apply voltages of different polarities on the memory cell 101.

For example, in applying one polarity of voltage (e.g., positive polarity), the bitline driver 247 drives a positive voltage relative to the ground on a bitline 241 connected to a row of memory cells in the array 132; and the wordline driver 245 drives a negative voltage relative to the ground on a wordline 243 connected to a column of memory cells in the array 132.

In applying the opposite polarity of voltage (e.g., negative polarity), the bitline driver 247 drives a negative voltage on the bitline 241; and the wordline driver 245 drives a positive voltage on the wordline 243.

The memory cell 101 is in both the row connected to the bitline 241 and the column connected to the wordline 243. Thus, the memory cell 101 is subjected to the voltage difference between the voltage driven by the bitline driver 247 on the bitline 241 and the voltage driven by the wordline driver 245 on the wordline 243.

In general, when the voltage driven by the bitline driver 247 is higher than the voltage driven by the wordline driver 245, the memory cell 101 is subjected to a voltage in one polarity (e.g., positive polarity); and when the voltage driven by the bitline driver 247 is lower than the voltage driven by the wordline driver 245, the memory cell 101 is subjected to a voltage in the opposite polarity (e.g., negative polarity).

To program the voltage threshold of the memory cell 101, the bitline driver 247 and the wordline driver 245 can drive a pulse of voltage onto the memory cell 101 in one polarity (e.g., positive polarity) to snap the memory cell 101 such that the memory cell 101 is in a conductive state. While the memory cell 101 is conductive, the bitline driver 247 and the wordline driver 245 continue driving the programming pulse to change the threshold voltage of the memory cell 101 towards a voltage region that represents the data or bit value(s) to be stored in the memory cell 101.

The controller 231 can be configured in an integrated circuit having a plurality of decks of memory cells. Each deck can be sandwiched between a layer of bitlines, a layer of wordlines; and the memory cells in the deck can be arranged in an array 132. Adjacent decks of memory cells may share a layer of bitlines (e.g., 241) or a layer of wordlines (e.g., 243). Bitlines are arranged to run in parallel in their layer in one direction; and the wordlines are arranged to run in parallel in their layer in another direction orthogonal to the direction of the bitlines. Each of the bitlines is connected to a row of memory cells in the array; and each of the wordlines is connected to a column of memory cells in the array. Bitline drivers 237 are connected to bitlines in the decks; and wordline drivers 235 are connected to wordlines in the decks. Thus, a typical memory cell 101 is connected to a bitline driver 247 and a wordline driver 245.

Optionally, the memory cell 101 is implemented using a selector/memory device. The selector/memory device has a chalcogenide (e.g., chalcogenide material and/or chalcogenide alloy). For example, the chalcogenide material can include a chalcogenide glass such as, for example, an alloy of selenium (Se), tellurium (Te), arsenic (As), antimony (Sb), carbon (C), germanium (Ge), and silicon (Si). A chalcogenide material can primarily have selenium (Se), arsenic (As), and germanium (Ge) and be referred to as SAG-alloy. SAG-alloy can include silicon (Si) and be referred to as SiSAG-alloy. In some embodiments, the chalcogenide glass can include additional elements such as hydrogen (H), oxygen (O), nitrogen (N), chlorine (Cl), or fluorine (F), each in atomic or molecular forms. The selector/memory device has a top side and a bottom side. A top electrode is formed on the top side of the selector/memory device for connecting to a bitline 241; and a bottom electrode is formed on the bottom side of the selector/memory device for connecting to a wordline 243. For example, the top and bottom electrodes can be formed of a carbon material. For example, a chalcogenide material of the memory cell 101 can take the form of a crystalline atomic configuration or an amorphous atomic configuration. The threshold voltage of the memory cell 101 can be dependent on the ratio of the material in the crystalline configuration and the material of the amorphous configuration in the memory cell 101. The ratio can change under various conditions (e.g., having currents of different magnitudes and directions going through the memory cell 101).

Figure 12:
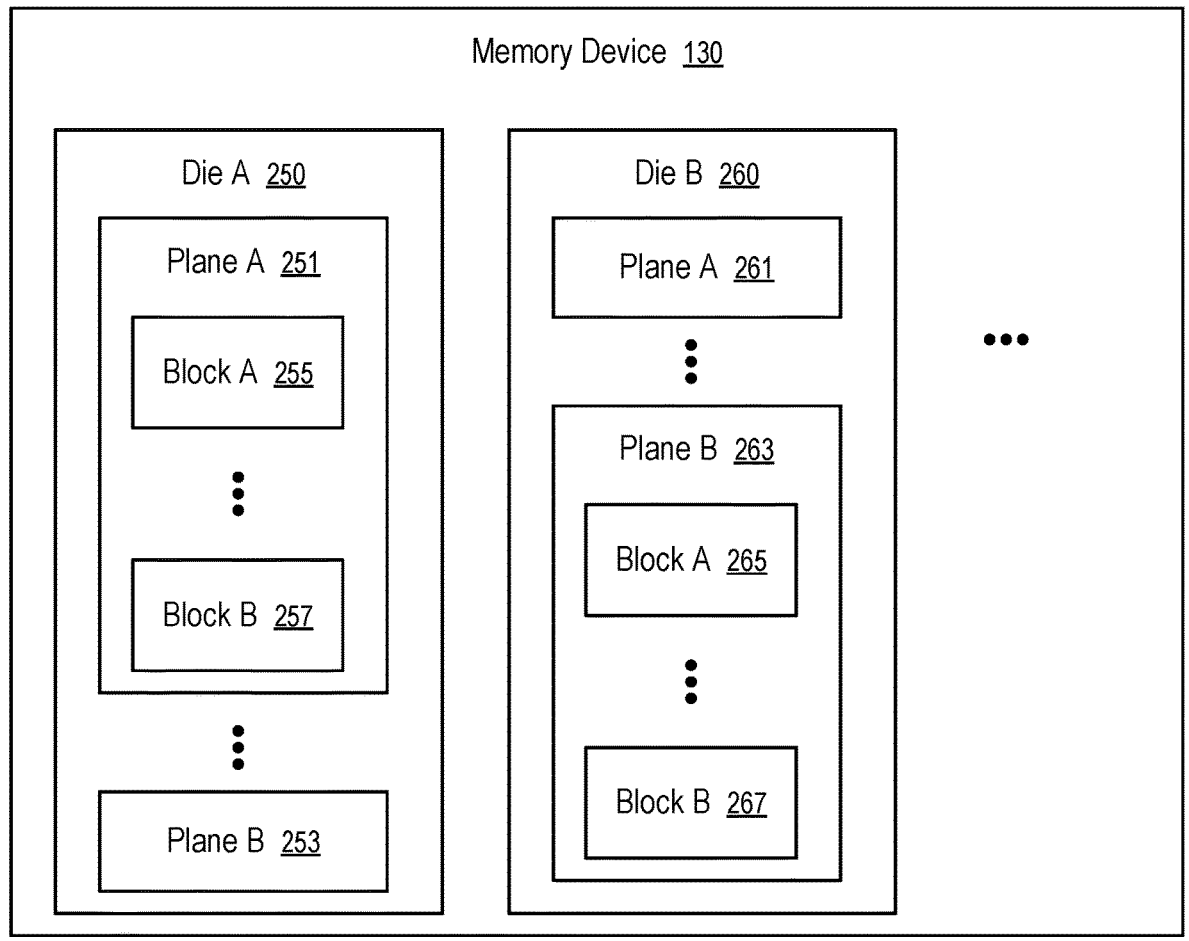
FIG. 12 illustrates a media structure of a memory device according to one embodiment.

FIG. 12 illustrates a media structure of a memory device 130 according to one embodiment. For example, the memory device 130 of FIG. 1 can have memory cells organized in a structure as in FIG. 12.

For example, the memory device 130 of FIG. 12 can have multiple integrated circuit dies 250, . . . , 260. Each of the integrated circuit dies (e.g., 250 or 260) can have multiple planes (e.g., 251, . . . , 253, or 261, . . . , 263) of memory cells (e.g., 101). Each of the planes (e.g., 251, or 263) can have multiple blocks (e.g., 255, . . . , 257, or 265, . . . , 267) of memory cells (e.g., 101). Each of the blocks (e.g., 255, 257, 265, or 267) can have multiple pages of memory cells (e.g., 101). The memory cells in each page is configured to be programmed to store/write/commit data together in an atomic operation; and the memory units in each block (e.g., 255) is configured to be erased data together in an atomic operation. Different commands can be issued to different dies 250, . . . , 260 for parallel execution; and a same command can be issued to multiple planes (e.g., 251, . . . , 253) in a die (e.g., 250) for parallel execution.

Figure 13:
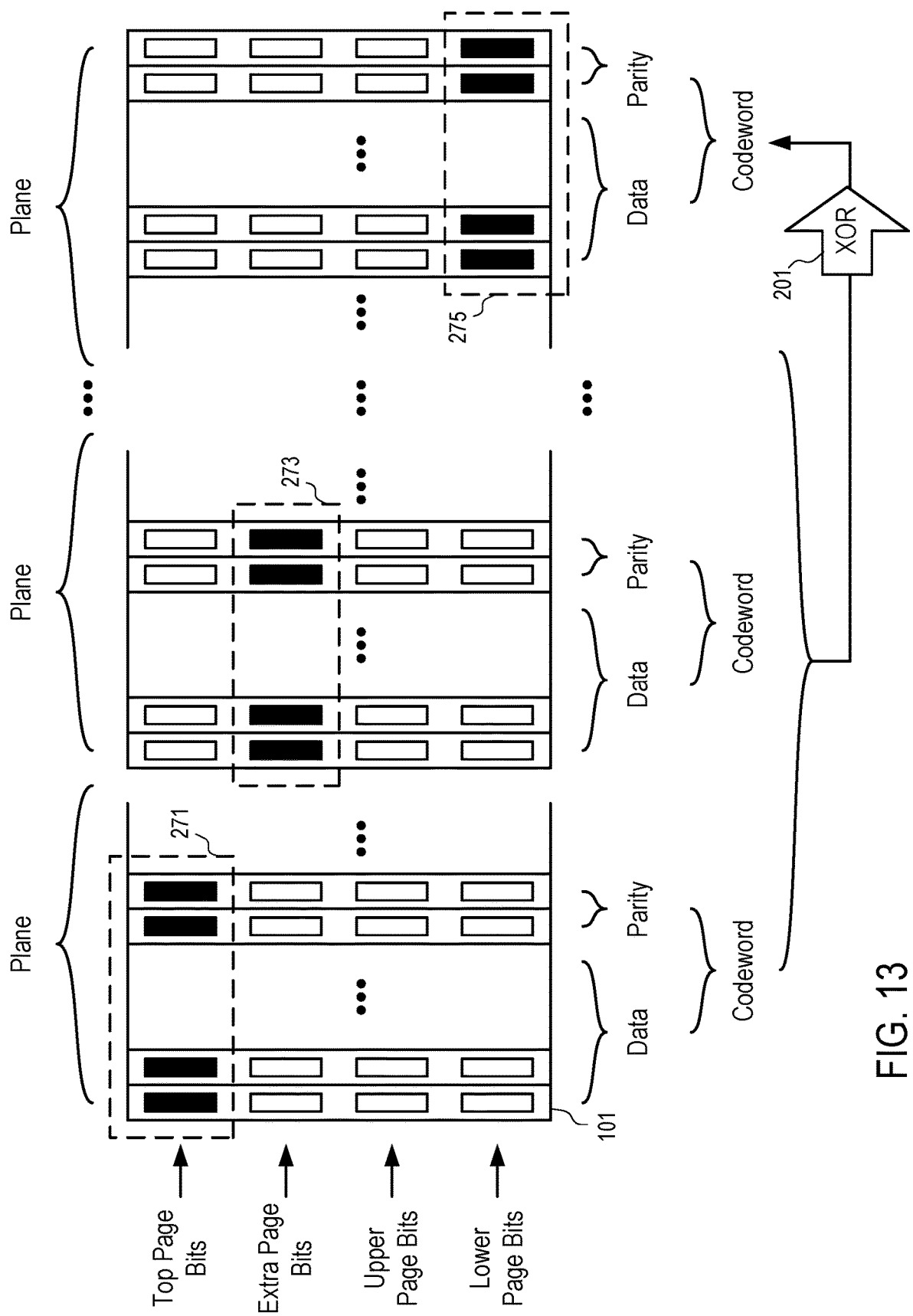
FIG. 13 shows a technique to improve data reliability for memory cells on a wordline according to one embodiment.

FIG. 13 shows a technique to improve data reliability for memory cells on a wordline according to one embodiment.

In the example of FIG. 13, each memory cell 101 is programmed to have a threshold voltage representing four bits: a top page bit, an extra page bit, an upper page bit, a lower page bit. For example, the technique of FIG. 6 to program a memory cell to store a four-bit data item can be used. Other techniques can also be used. FIG. 13 illustrates the technique using an example of programming four bits per memory cell. In general, the technique can be applied to programming data with a different number of bits per memory cell, such as three bits per memory cell, or higher than four bits per memory cell.

A number of memory cells connected to a wordline 243 can be used to store a codeword 271, which includes bits for the data item and bits for parity that provides redundant information for the data item to enable error recovery using an error correction code technique (e.g., Low-Density Parity-Check (LDPC)).

For example, a plane of memory cells in the memory device 130 can have memory cells connected to a wordline 243 and having the capacity to store a plurality of codewords (e.g., 271). The codewords in the plane and on the wordline 243 can be in one or more pages, with each page to be programmed together, and one or more blocks, with each block to be erased together.

Further, the memory device 130 can have multiple planes for the wordline 243. The planes have the same structure such that a same operation (e.g., read) can be performed in parallel in the multiple plane.

In general, to meet a performance level in error recovery, the number of bits used for the parity increases when the bit error rate in the data read as the codeword 271 from the memory cells increase. To meet the performance level requirement of a worst performing memory cell group, the number of bits for the parity can be too high for the majority of memory cell groups and thus reduce the overall storage efficiency of the memory device 130.

When the memory device 130 is designed to have the number of parity bits suitable for the desirable performance level in the majority of memory cell groups, some memory cell groups connected to a wordline 243 may not be able to meet the desirable performance level using the number of parity bits designed for the memory device 130. To improve the performance level, additional redundant information can be stored in the storage capability provided in some of the memory cells that are typically used to store a codeword for a separate data when the additional redundant information is not necessary.

For example, when the set of memory cells connected to the wordline 243 in the planes have a bit error rate below a threshold, the lower page bits of memory cells corresponding to the codeword 275 can be used to store a data item not related to other data items stored in the planes on the wordline 243. When at least some of the set of memory cells has a high bit error rate, a portion of the storage capacity of the set of memory cells, such as the storage capacity corresponding to the codeword 275, can be used to store additional redundant information to improve error recovery capability. It is not necessary to store the additional redundant information in the storage capacity (e.g., corresponding to the codeword 275) having a low bit error rate. It can be desirable to store the additional redundant information in the storage capacity (e.g., corresponding to the codeword 275) having a relatively high bit error rate such that the host data is stored with a relatively low bit error rate.

For example, when the set of memory cells connected to the wordline 243 in the planes have a bit error rate above the threshold, the storage capacity of the codeword 275 can be used to store redundant information of some of the codewords (e.g., 271, 273, . . . ) to improve the error recovery capability for the codewords (e.g., 271, 273, . . . ).

For example, an XOR operation 201 can be applied to the codewords 271, . . . , 273 to generate a codeword 275. By storing the codeword 275 that is an XOR of the codewords 271, . . . , 273, additional redundant information is available to assist the recovery of a codeword (e.g., 271) that would fail to recovery without the additional redundant information. The codewords 271, . . . , 273 can be distributed in to different planes that can be read in parallel. By aligning the timing of the reading of the codewords 271, . . . , 273 in the different planes, the latency to retrieve the codewords 271, . . . , 273 for error recovery via the additional redundant information provided by the codeword 275 can be reduced. Alternatively, in other implementations, some or all of the codewords 271, . . . , 273 (and/or 275) linked with the additional redundant information are configured within a same plane.

The codewords 271, . . . , 273 combined to generate the redundant codeword 275 can be from different planes formed using different page types (e.g., top page bits, extra page bits, upper page bits, lower page bits). Since the bit error rates can vary among different page types, mixing the codewords 271, . . . , 273 from different page types in generating the redundant codeword 275 can average the bit error rates among the combined codewords 271, . . . , 273, and thus avoid a scenario of combining codewords 271, . . . , 273 having the worst high bit error rates.

Other techniques to generate and store redundant information for the codewords (e.g., 271, 273) can be used to improve the error recovery capability for the wordline 243.

For example, a parity bit of the codeword 271 in a plane (or some or all of the codewords in the plane) can be computed and stored in a bit provided by the storage capacity of the codeword 275 in another plane.

For example, a parity bit of combined/linked codewords 271, . . . , 273 in some of the planes can be computed and stored in a bit provided in the storage capacity of the codeword 275 of a plane.

For example, one or more parity bits can be added to each codeword (e.g., 271); and the bits of the enlarged codewords can be redistributed among the storage spaces provided by the memory cells on the wordline 243. For example, the number of top page bits of the set memory cells on the wordline 243 is designed to accommodate a number of codewords each having the number of bits of data and the number of bits of parity as the codeword 271, such that the boundaries of codewords are aligned with the boundaries of pages, blocks, and planes. When the number of parity bits is increased, the number of codewords that can be stored in the same number of top page bits is reduced; and at least some of the boundaries of the enlarged codewords will misaligned with the boundaries of pages, blocks, and/or planes.

When the redundant information stored in the storage space for the codeword 275 is linked to multiple codewords in pages, blocks, and/or planes, a change to one of the codewords can lead to a change in the redundant information in the storage space of the codeword 275. Thus, it is preferred that the multiple codewords in pages, blocks, and/or planes are used together to avoid excessive write amplification for the memory cells providing the storage space for the codeword 275.

In some implementations, the write amplification can be distributed across the pages, blocks, and/or planes having the linked codewords (e.g., 271, 273). For example, when the codewords 271, . . . , 273, are XOR'ed to generate the redundant codeword 275, any of the codewords 271, . . . , 273 and 275 is the XOR of the remaining codewords and thus can be considered the redundant codeword; and a controller (e.g., 115 or 150) can rotate the role of the storage spaces of the codewords 271, . . . , 273, and 275 as the storage space for the redundant codeword and thus spreading the write amplification across the pages, blocks and/or planes.

In some implementations, the host system 120 provides data to the memory sub-system 110 containing the memory device 130 for storing in the unit of a predetermined block size (e.g., corresponding to a data unit for a logical block address (LBA)). When a controller (e.g., 115 or 150) uses the storage space of the codeword 275 to store redundant information, a storage block that previously has the capacity to store the entire data unit has a reduced storage capacity. The controller (e.g., 115 or 150) can spread the data unit for storing in multiple storage blocks of reduced storage capacity. Alternatively, the controller (e.g., 115 or 150) can allocate an entire storage block, corresponding to the storage requirement of an LBA block of data, for storing redundant information, such as the redundant codeword 275.

In some implementations, the projection of whether a wordline needs extra parity protection can be determined by measuring the sensitivity of the memory cells to stress (e.g., typically retention time & temperature). The stress can determine whether extra ECC is needed for some potential future condition. If the projected error rate will be too high, extra ECC will be needed on the memory cells. Some dies can be more sensitive to data retention (which is a function of the temperature) than other die. Further, on dies with greater sensitivity it is observed that the worst wordlines on the die suffer more loss of margin, or increase in bit error rate, than the average wordline on the same die. So, while the current bit error rate of a wordline is insufficient in determining whether extra ECC will be needed in case of power loss (followed by retention), a pattern of changes in bit error rates of a wordline can be used to predict whether the wordline needs extra parity protection. The calibration circuit 345 can measure the signal and noise characteristics 339 of data stored in the memory cells connected to the wordline to determine whether the bit error rate of the memory cells is above a threshold; and if the bit error rate is above the threshold, the controller (e.g., 115 or 150) uses a portion of the storage capacity of the memory cells to store redundant information (e.g., codeword 275 that is generated by applying an XOR operation 201 on the codewords 271, . . . , 273), in addition to the predetermined number of parity bits for each codeword.

For example, the bit error rate of the memory cells can be measured or predicted using the technique of FIG. 8 and FIG. 9. Other techniques can also be used (e.g., by comparing the data written into the memory cells and data represented by the threshold voltages determined through reading operations).

For example, when the memory cells age or experience of a number of program and erasure cycles, the bit error rate of data represented by the threshold voltages of the memory cells can change. Based on the measured bit error rate, the controller (e.g., 115 or 150) can selectively and/or dynamically to determine whether to store an XOR of the codewords 271, . . . , 273, or use the storage space of the codeword 275 to store additional data unrelated to the codewords 271, . . . , 273.

For example, when the operating temperate of the memory cells changes, the bit error rate can change. In response, additional redundant information can be selectively stored in response to reduce or minimize data corruption/loss.

In some implementations, the wordlines (e.g., 243) that are likely to have high bit error rates under various conditions can be determined from similar memory devices. Based on the conditions, the wordlines can be configured to store additional redundant information for improved error recovery capability with reduced storage capacity for storing independent data items.

FIGS. 14 to 23 show various techniques to improve data reliability for memory cells on a wordline according to one embodiment.

Figure 14:
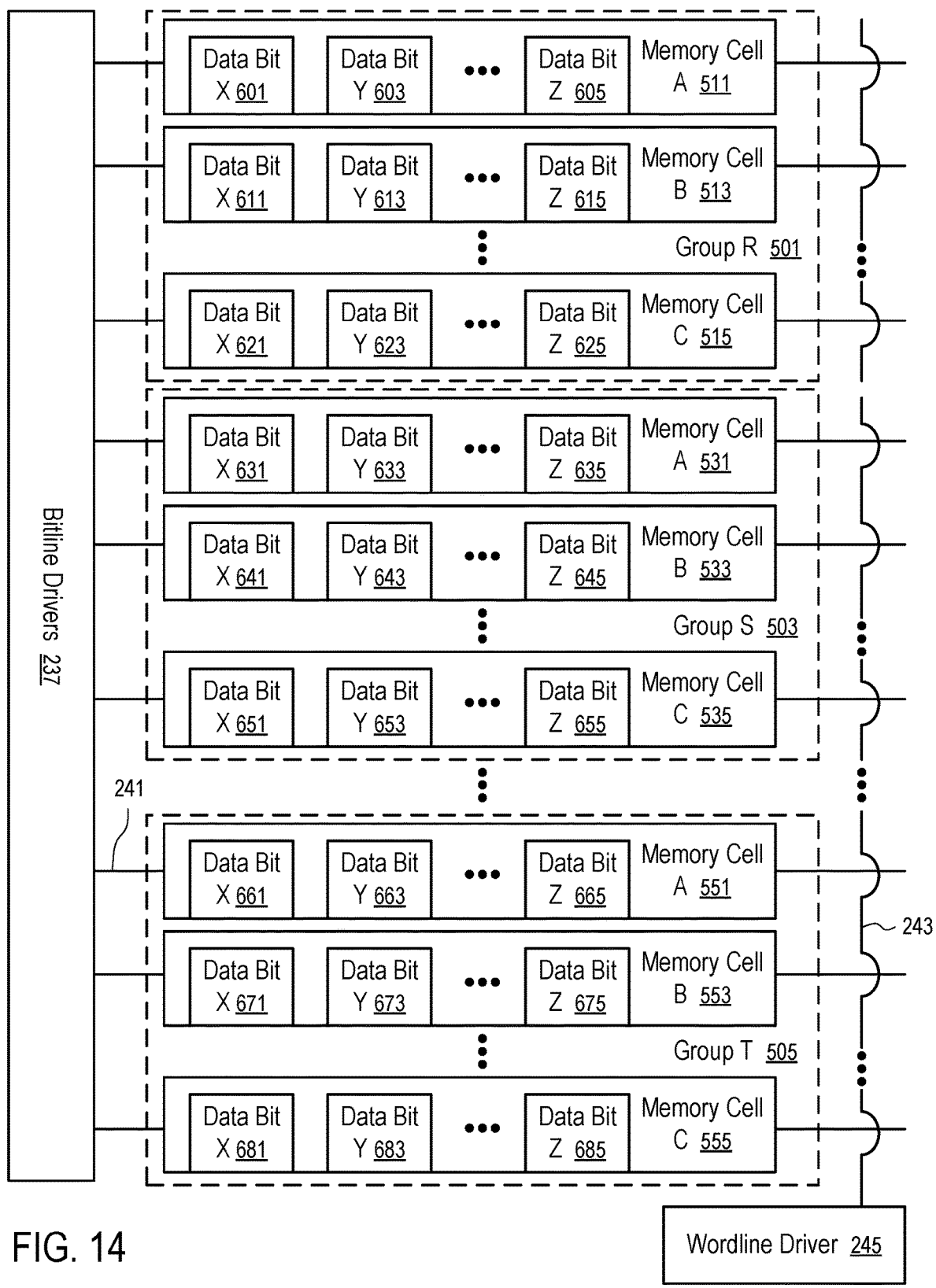
FIGS. 14 to 23 show various techniques to improve data reliability for memory cells on a wordline according to one embodiment.

As illustrated in FIG. 14, a wordline 243 can be driven by at least one wordline driver 245. The wordline 243 is connected to a plurality of memory cell groups 501, 503, . . . , 505. The memory cells connected to the wordline 243 can be connected to bitline drivers 237 via respective bitlines (e.g., 241). The memory cells on the wordline 243 can be read in parallel.

Each memory cell group (e.g., 501, 503, or 505) has a predetermined number of memory cells (e.g., 511, 513, . . . , 515; 531, 533, . . . , 535; or 551, 553, . . . , 555). Each memory cell (e.g., 551) can be programmed to have a threshold voltage representative of a predetermined bits (e.g., 601, 603, . . . , 605). For example, when the memory cell 511 is programmed to store four bits (QLC mode), the data bits 601, 603, . . . , 605 corresponds to top page bit, extra page bit, upper page bit, and lower page bit.

The set of bits of a same page type (e.g., bits 601, 611, . . . , 621, 631, 641, . . . , 651, . . . , 661, 671, . . . , 681) corresponds to the bits of the page type (e.g., top page bits, extra page bits, upper page bits, lower page pages for QLC mode). Thus, the set of bits 603, 613, . . . , 623, 633, 643, . . . , 653, . . . , 663, 673, . . . , 683 corresponds another page type; and the set of bits 605, 615, . . . , 625, 635, 645, . . . , 655, . . . , 665, 675, . . . , 685 corresponds a further page type.

The memory cell groups 501, 503, . . . , 505 can be formed on multiple pages, multiple blocks (e.g., 255, . . . , 257), and/or multiple planes 251, . . . , 253 on a same integrated circuit die 250.

In general, the memory cell groups 501, 503, . . . , 505 can be a portion of the entire set of memory cell groups on the wordline 243, or a subset of the memory cell groups on the wordline 243. When the memory cell groups 501, 503, . . . , 505 are on multiple planes 251, . . . , 253, the cell groups 501, 503, . . . , 505 form a same structure for each of the planes.

Each memory cell group (e.g., 501) can be configured to store a number of data bits and another number of parity bits in each page type. In general, each memory cell group (e.g., 501) can include one or more independent codewords.

When the bit error rate of the data bits 601 to 685 is above a threshold, a portion of the memory cells in the memory cell groups 501, 503, . . . , 505 is used to store redundant information to assist error recovery.

Figure 15:
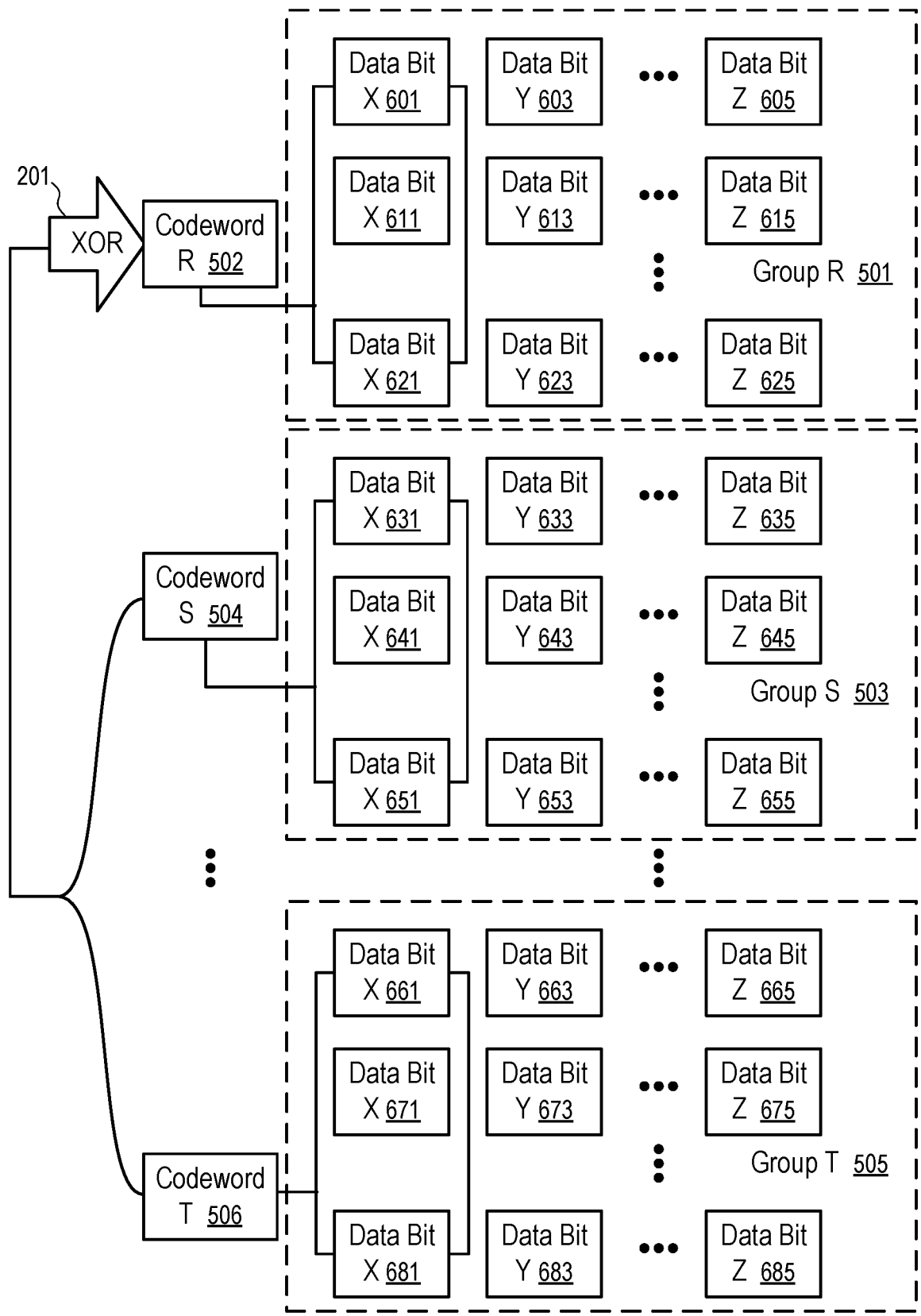

FIG. 15 illustrates an example of using the data bits 601, 611, . . . , 621 in a memory cell group 501 to store the XOR of the corresponding data bits of other groups 503, . . . , 505. For example, data bits 631, 641, . . . , 651 in the memory cell group 503 represent a codeword 504; and data bits 661, 671, . . . , 681 in the memory cell group 505 represent another codeword 506. The XOR operation 201 of the codewords 504, . . . , 506 generates a codeword 502 having the data bits 601, 611, . . . , 621. For example, the data bit 601 is the XOR 201 of the corresponding data bits 631, . . . , 661 in the memory cell groups 503, . . . , 505; the data bit 611 is the XOR 201 of the corresponding data bits 641, . . . , 671 in the memory cell groups 503, . . . , 505; and the data bit 621 is the XOR 201 of the corresponding data bits 651, . . . , 681 in the memory cell groups 503, . . . , 505. Storing the codeword 502 in the memory cell group 501 can improve the capability of recovering from random bit errors in the codewords 504, . . . , 506. Without the redundant information provided by the codeword 502, the memory device 130 and/or the memory sub-system 110 may fail to decode one or more of the codewords 504 from the data bits 631 to 681 read from the memory cells in the groups 503, . . . , 505.

Figure 16:
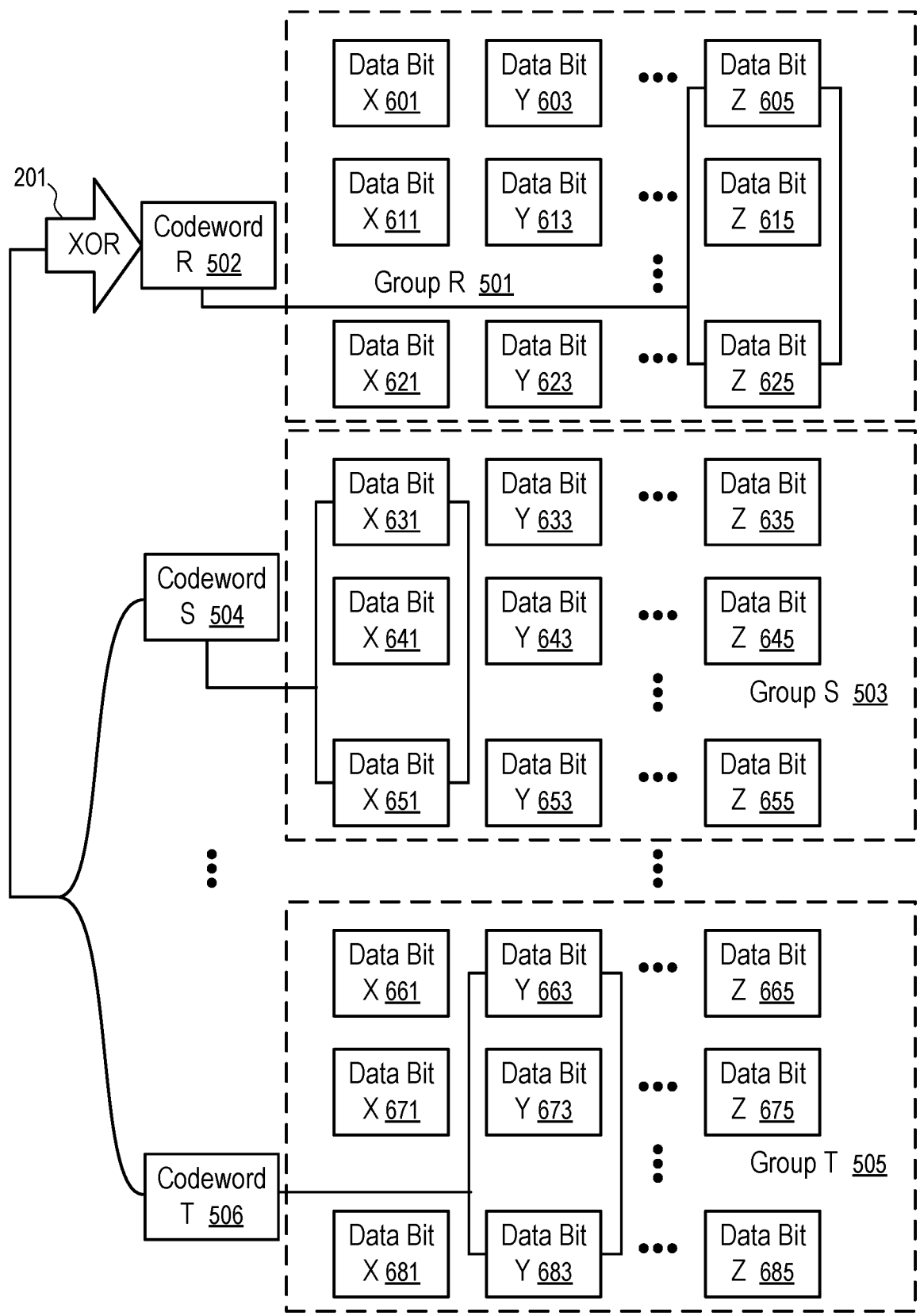

Codewords from different plane types can be mixed in generating the codeword 502 to provide additional redundant information, as illustrated in FIG. 16.

In FIG. 16, a codeword 504 of one page type is XOR with a codeword 506 of a different page type to generate the redundant codeword 502. The codewords 504, . . . , 506, and 502 can be distributed in different page types in the memory cell groups 503, . . . , 505, and 501 to avoid linking the worse performing codewords together.

Figure 17:
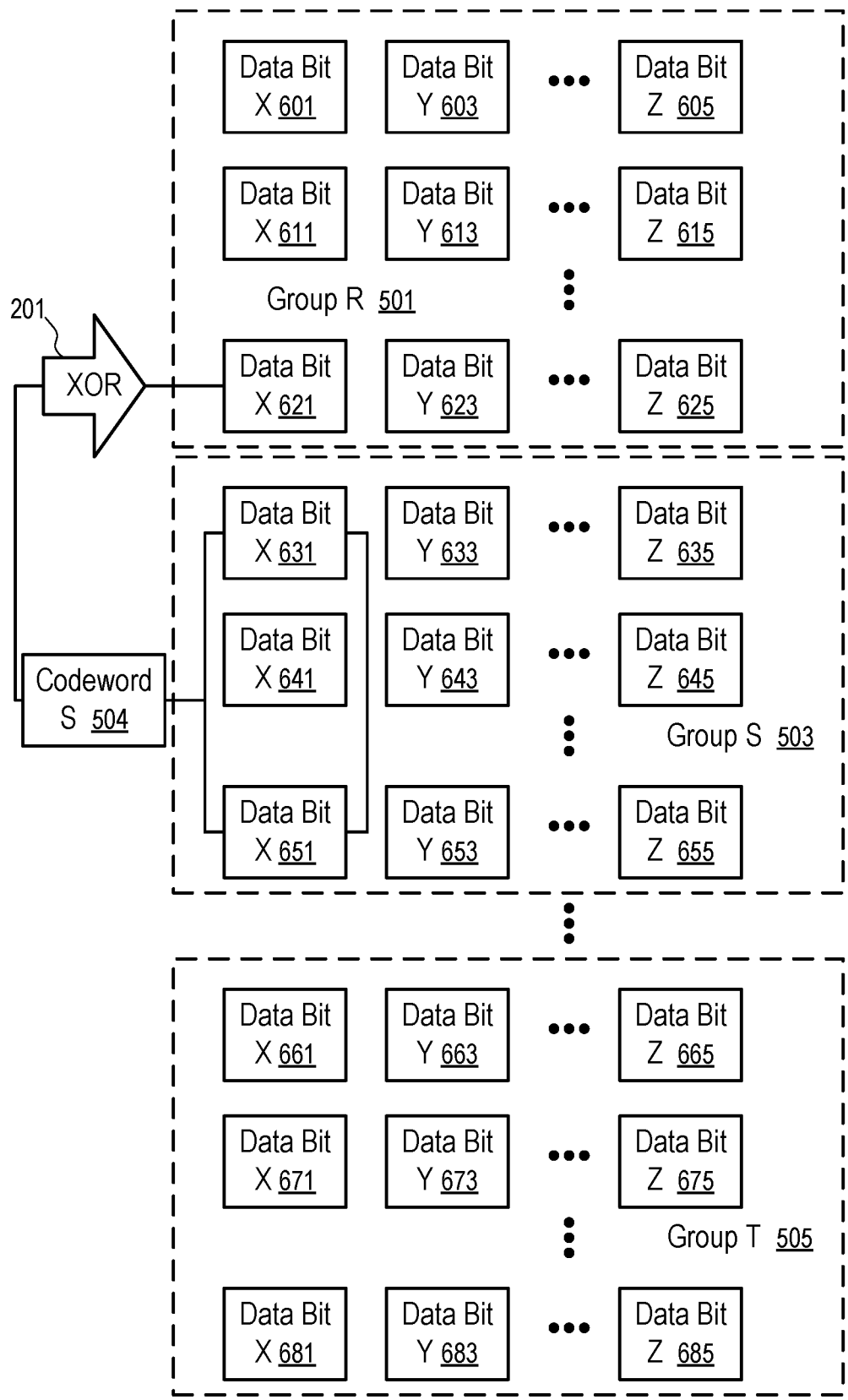

FIG. 17 illustrates an example of storing redundant information in the form of a parity bit of a codeword 504 having data bits 631, 641, . . . , 651 in the memory cell group 503. In some implementations, the data bit 621 provides an extra bit of parity information such that the combination of the data bits 631, 641, . . . , 651 and 621 provides an enlarged codeword having improved error recovery capability. For example, the data bit 621 can be the XOR of a subset of the data bits 631, 641, . . . , 651 according to a LDPC technique.

Figure 18:
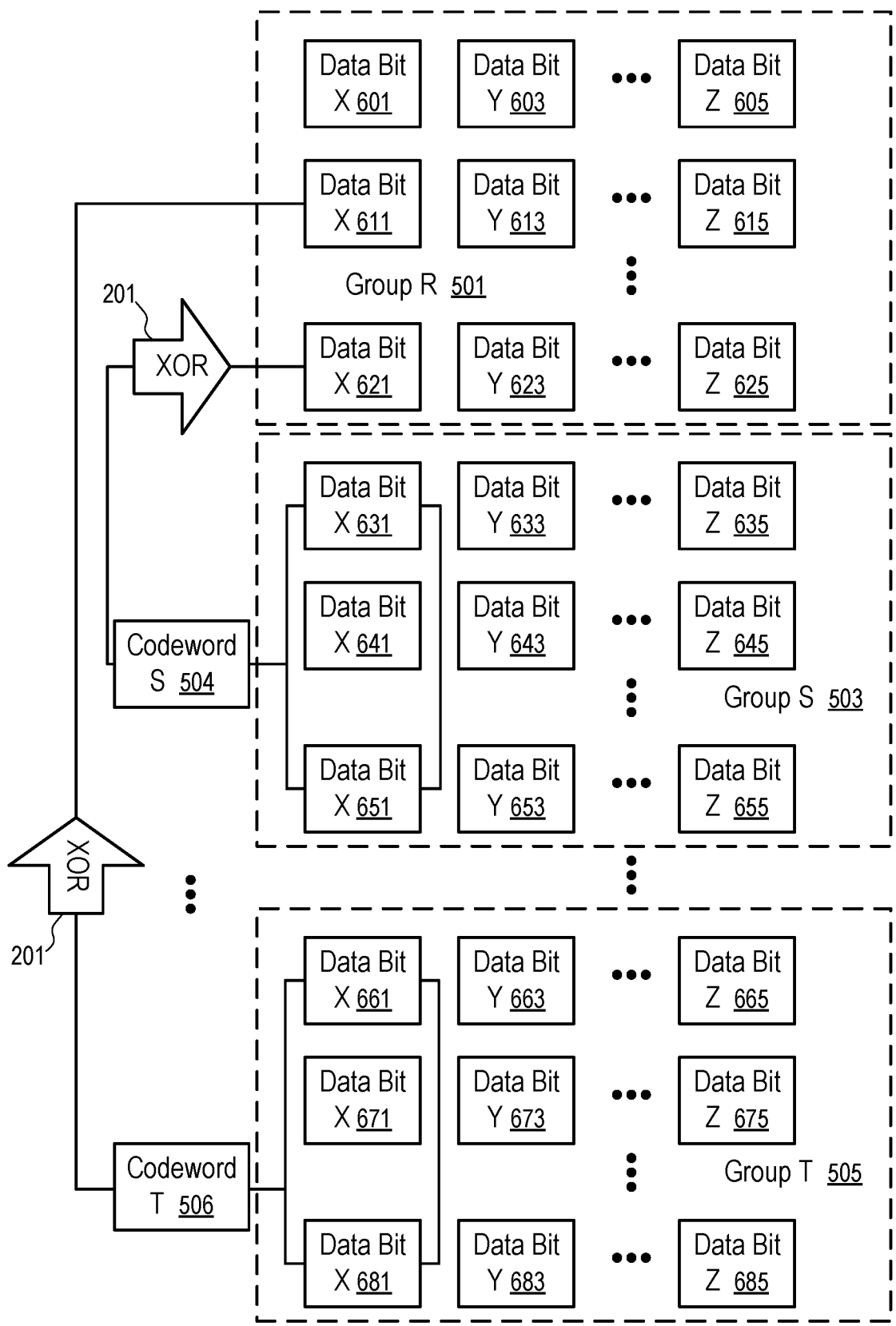

FIG. 18 illustrates an example of using the data bits 621, . . . , 611 of a memory cell group 501 to store the extra parity bits for the codewords 504, . . . , 506 in the other memory cell groups 503, . . . , 505.

Figure 19:
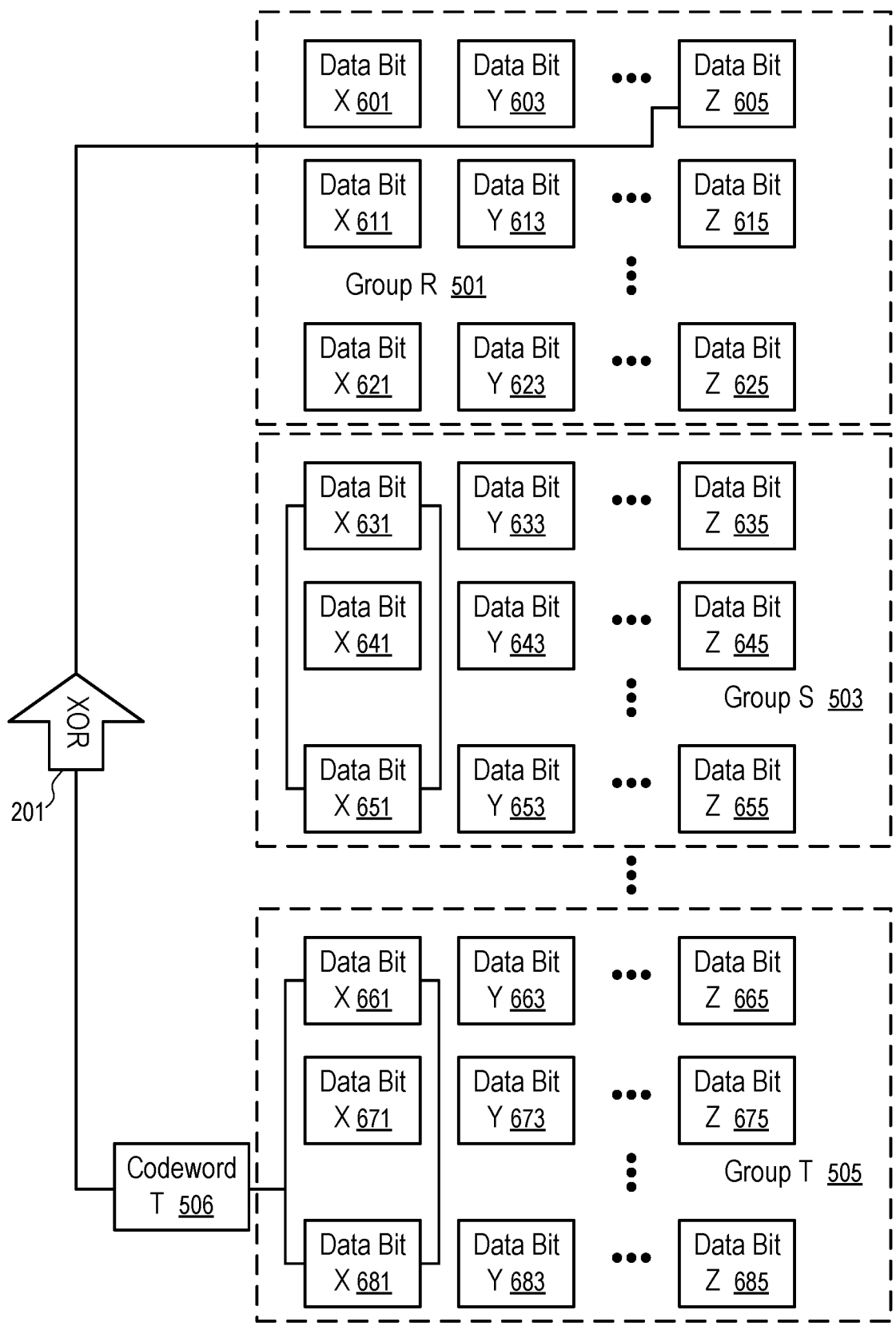

The extra bit stored in the memory cell group for a codeword in another memory cell group can be distributed over different page types, as illustrated in FIG. 19.

In FIG. 19, the codeword 506 having the data bits 661, 671, . . . , 681 of one page type in a memory cell group 505 can be expanded to have an additional parity bit 605 of another page type in the memory cell group 501.

Figure 20:
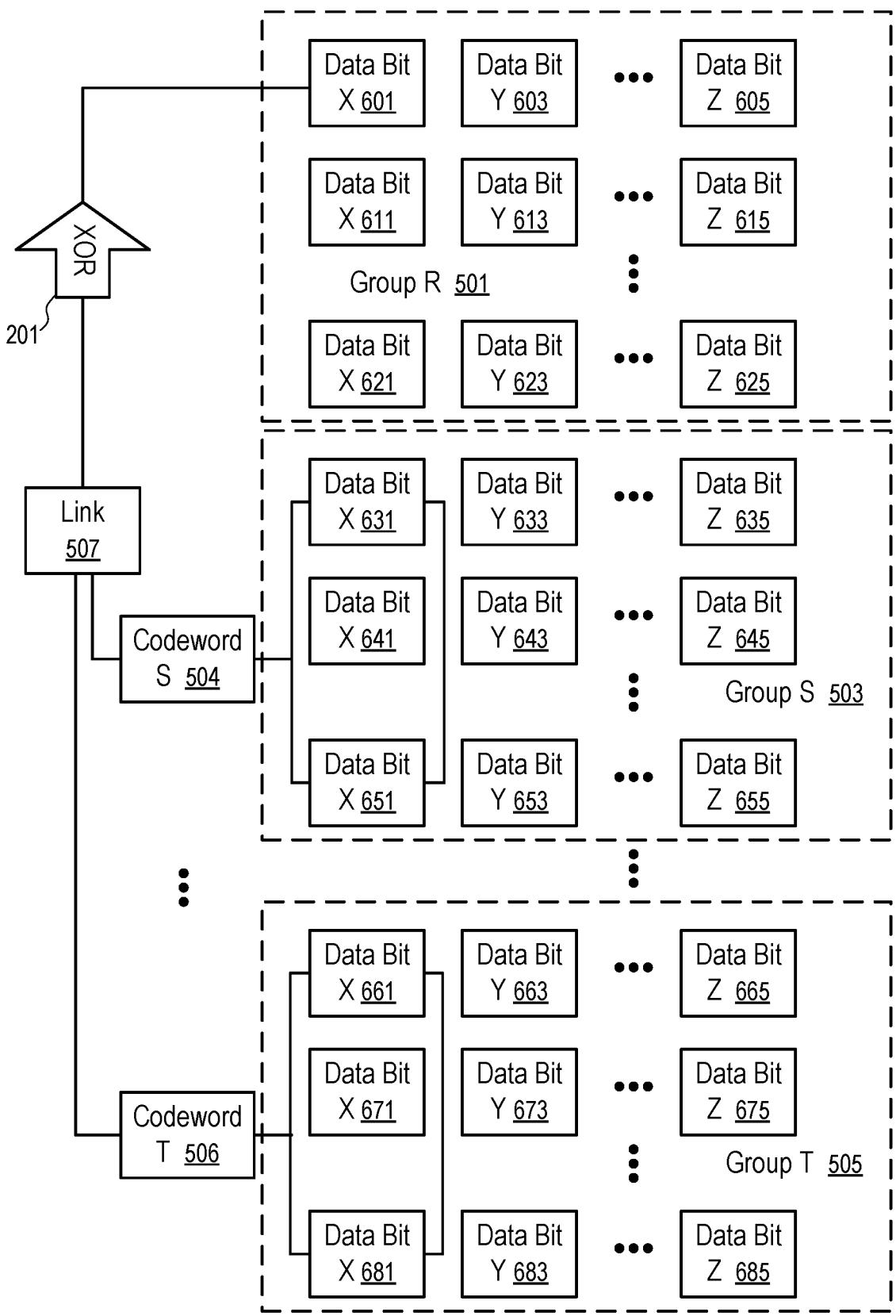

In some implementations, more than one codeword can be linked to share an expanded parity bit, as illustrated in FIG. 20.

In FIG. 20, the codewords 504, . . . , 506 of a page type from at least some of the memory cell group 503, . . . , 505 are combined via a link operation 507, and the combined codeword is expanded to have an extra parity bit 601.

Figure 21:
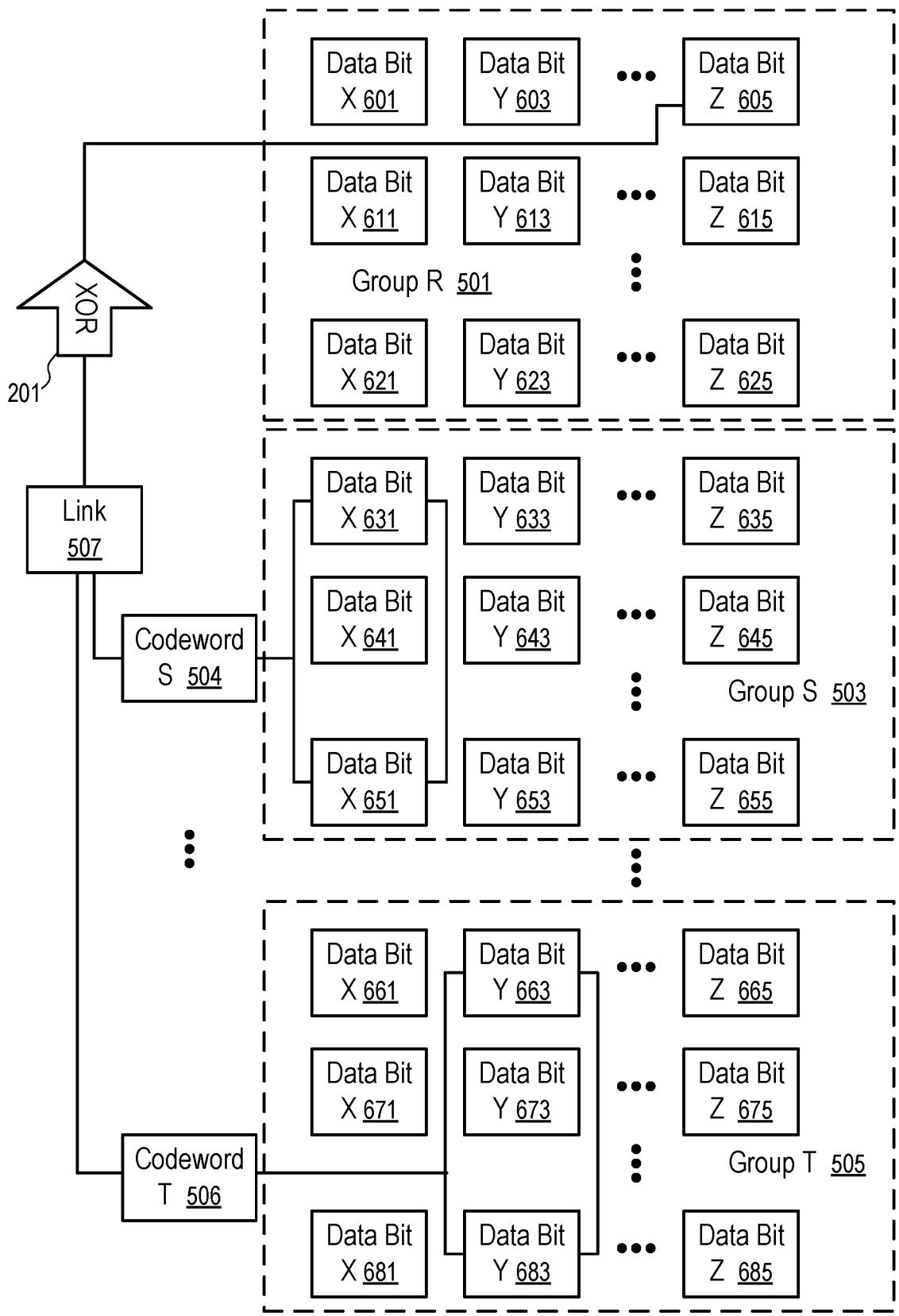

The codewords from the group 503 and 505 and the extra parity for the linked codewords can be distributed across different page types, as illustrated in FIG. 21.

In FIG. 21, the codewords 504, . . . , 506 of different page types from at least some of the memory cell group 503, . . . , 505 are combined via a link operation 507, and the combined codeword is expanded to have an extra parity bit 601 of a further page type.

Figure 22:
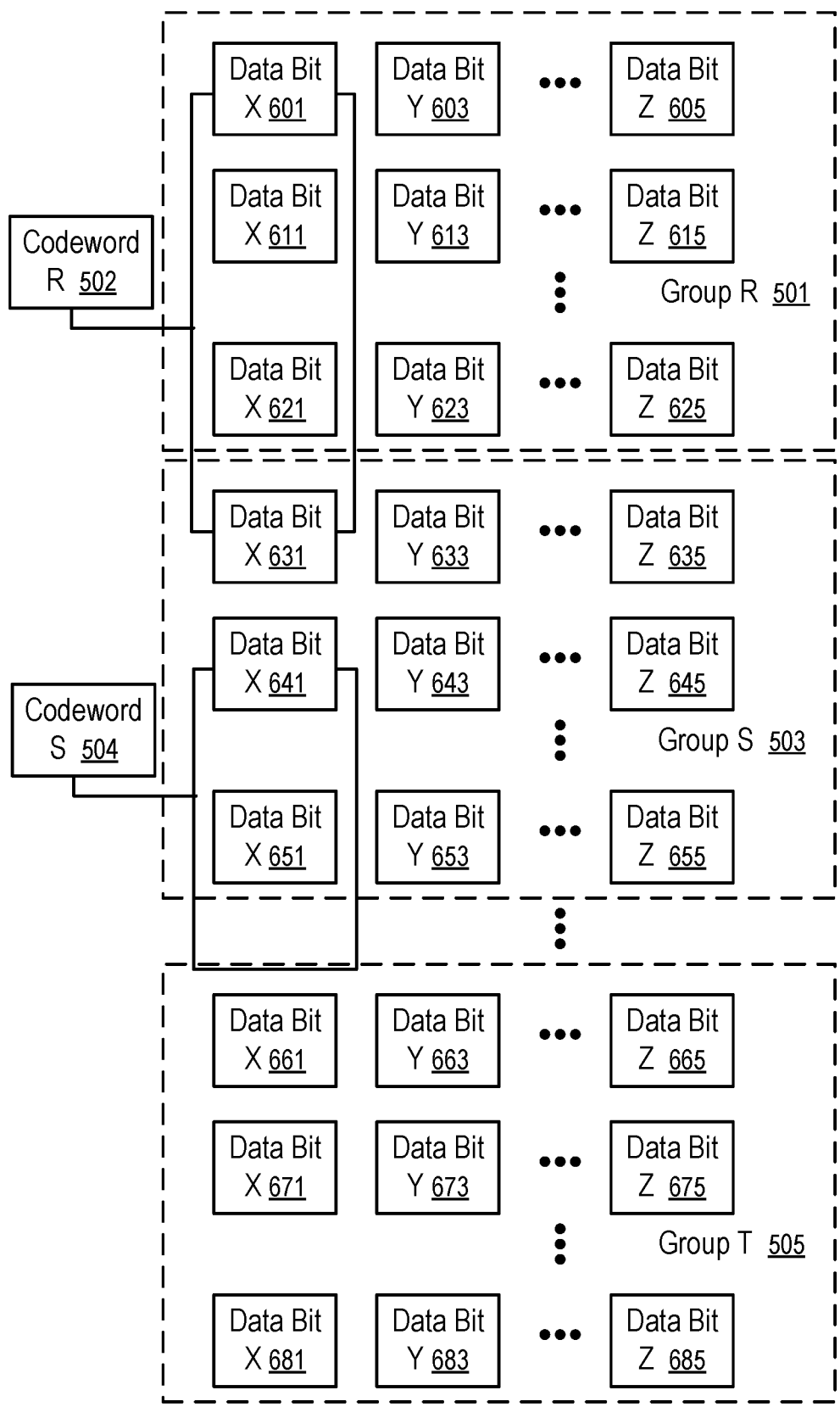

FIG. 22 illustrates an example of adding a parity bit for each codeword (e.g., 502 or 504), and distributing the bits of enlarged codewords across the memory cell groups 501, 503, . . . , 505. Since the codeword (e.g., 502) is enlarged, the codewords (e.g., 502, or 504) can span across memory groups, across boundaries of pages, blocks, and/or planes. For example, the codeword 502 includes not only the data bits 601, 611, . . . , 621 from the memory cell group 501, but also an extra bit 631 from the next memory cell group 503. The extra bit 631 can be the XOR of a subset of the data bits 601, 611, . . . , 621 according to a LDPC technique.

Figure 23:
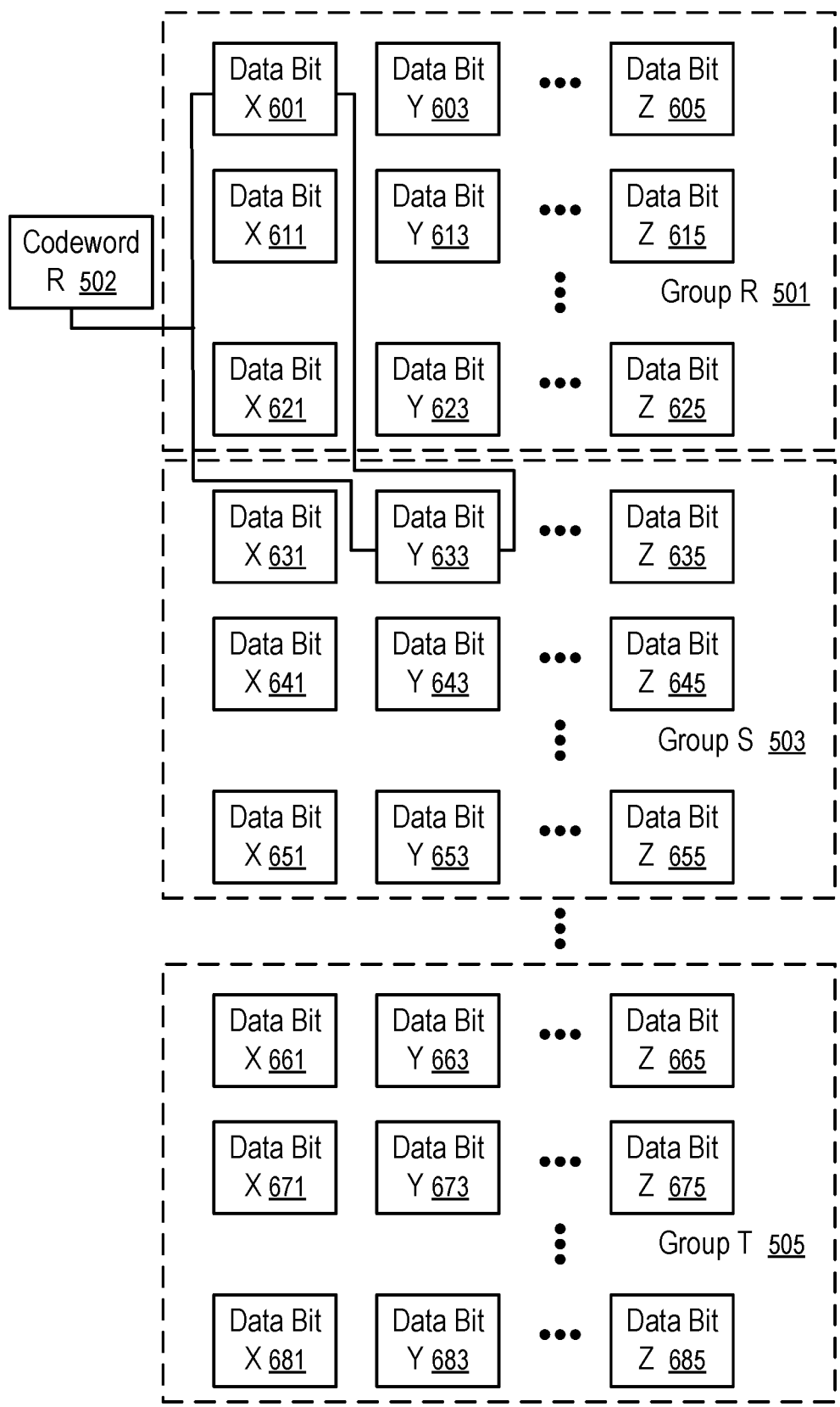

Further, the expanded codewords can use data bits of different types, as illustrated in FIG. 23.

In FIG. 23, an expended codeword 502 includes data bits 601, 611, . . . , 621 of a page type from the memory cell group 501, and a data bit 633 of another page type from another memory cell group 503.

FIGS. 13 to 23 illustrate examples of generating redundant information using XOR operations 201. Alternatively, XNOR operations can be used.

Figure 24:
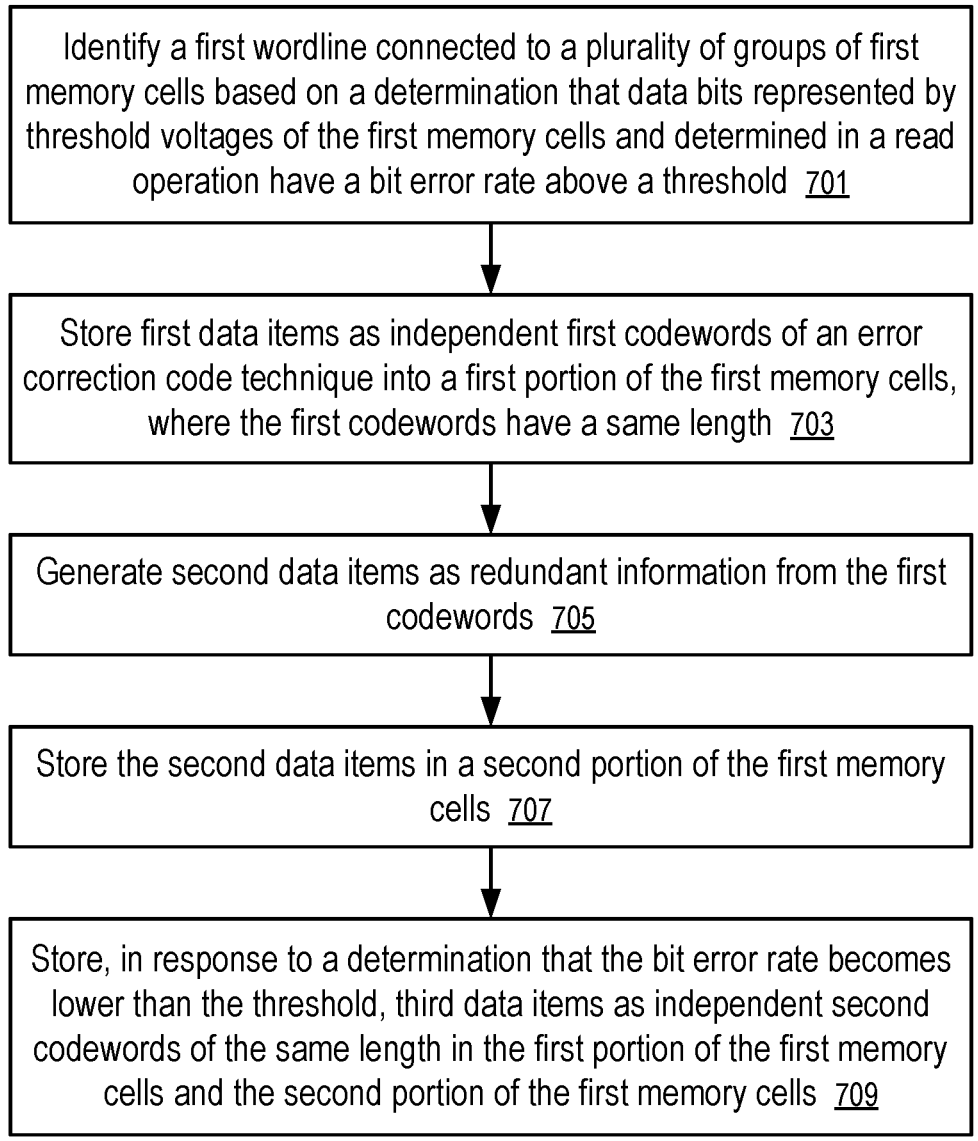
FIG. 24 shows a method to dynamically deploy error correction techniques according to one embodiment.

FIG. 24 shows a method to dynamically deploy error correction techniques according to one embodiment. The methods can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method is performed at least in part by the controller 115 of FIG. 1, or processing logic in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 701, a memory sub-system 110 having a memory device 130 identifies a first wordline 243 connected to a plurality of groups 501, 503, . . . , 505 of first memory cells (e.g., 511 to 555) based on a determination that data bits (e.g., 601 to 685) represented by threshold voltages (e.g., 209) of the first memory cells and determined in a read operation have a bit error rate above a threshold.

For example, a data integrity classifier 313 can dynamically estimate the bit error rate based on signal and noise characteristics 339 of first memory cells. Alternatively, the bit error rate can be estimated based on a pattern of bit error rates of memory cells on different wordlines, based on the usage history of the memory device 130 (e.g., experienced number of cycles of program and erasure), the current operating condition of the memory device 130 (e.g., temperature), the predicted operating condition of the memory device 130 in a subsequent period of time during which the first memory cells are to be read to retrieve their stored data, etc.

In response to the bit error rate is determined or predicted to be above the threshold, the memory sub-system 110 performs operations in blocks 703, 705 and 707 to use a portion of the storage capacity of the first memory cells to store redundant information of data stored in the remaining portion of the storage capacity of the first memory cells. As a result, the storage capacity of the first memory cells to store independent data is reduced; and the error recovery capability for the data stored in the first memory cells is improved to accommodate the elevated bit error rate.

In contrast, when the bit error rate is determined or predicted to be below the threshold, the portion used to store the redundant information can be used to store separate data independent of the data stored in the remaining portion of the storage capacity of the first memory cells. As a result, the usage of the storage capacity of the first memory cells is improved without comprising the error recovery capability for the data stored in the first memory cells.

At block 703, the memory sub-system 110 stores first data items as independent first codewords of an error correction code technique into a first portion of the first memory cells, such as memory cell groups 503, . . . , 505. The first codewords have a same length, each having a predetermined number of data bits and another predetermined number of parity bits.

At block 705, the memory sub-system 110 generates second data items as redundant information from the first codewords.

For example, each of the second data item can be generated from a subset of the first codewords; and each of the second data item can be generated from an XOR operation (or an XNOR operation) applied on the subset of the first codewords. The number of first codewords used to compute a second data item can vary based on the bit error rates of memory cells used to store the first codewords. When the bit error rates in the memory cells are high, a small number of first codewords can be used to compute a second data item to improve the error recovery capability to a level matching the high bit error rates. When the bit error rates in the memory cells are low, the large number of first codewords can be used to compute a second data item to reduce the use of storage capacity for addition redundant information, in view of the reduced need for error recovery capability corresponding to a level matching the low bit error rates. When the error recovery capability of the first codewords are sufficient for the bit error rates of the memory cells, the storing of a second data item can be skipped so that the storage capacity of such a second data item can be used for storing additional independent data.

At block 707, the memory sub-system 110 stores the second data items in a second portion of the first memory cells, such as a memory cell group 501.

For example, at least a portion of the subset of the first codewords can be distributed across different page types (e.g., top page, extra page, upper page, lower page when the first memory cells are programmed in a QLC mode).

For example, at least a portion of the subset of the first codewords can be distributed across different planes.

For example, the second portion can be in a plane that is different from at least some of the planes of the first portion.

At block 709, in response to a determination that the bit error rate becomes lower than the threshold, the memory sub-system 110 stores third data items as independent second codewords of the same length in the first portion of the first memory cells and the second portion of the first memory cells.

Since both the first portion of the first memory cells and the second portion of the first memory cells are used to store the independent second codewords when the bit error rate is low, the first memory cells can be used to store more independent data than when the bit error rate is high.

Different wordlines in the memory device 130 can have different bit error rates and be used differently in whether or not to use a portion of the memory cells in a wordline to store additional redundant information. For example, the memory sub-system 110 can identify a second wordline connected to a plurality of groups of second memory cells based on a determination that data bits represented by threshold voltages of the second memory cells and determined in a read operation have a bit error rate below the threshold; and in response, the memory sub-system 110 can store third data items as independent third codewords into the second memory cells, without generating redundant information from the third codewords for storing into the second memory cells. The third codewords have the same length as the first codewords.

Since the amount of redundant information stored in the memory device 130 is selectively adjusted and/or dynamically adjusted based on bit error rates, the overall average number of bits of independent information stored in the memory device 130 is improved and/or optimized. It's improved or optimized compared to allocating the same amount of parity on all wordlines and/or on all die. Applying the extra ECC where it is needed (e.g., based on individual wordlines) can achieve a much lower cost solution than allocating the space for parity based upon the absolute weakest wordline in a population of a die, and applying the same application to all of the wordlines on the die.

Figure 25:
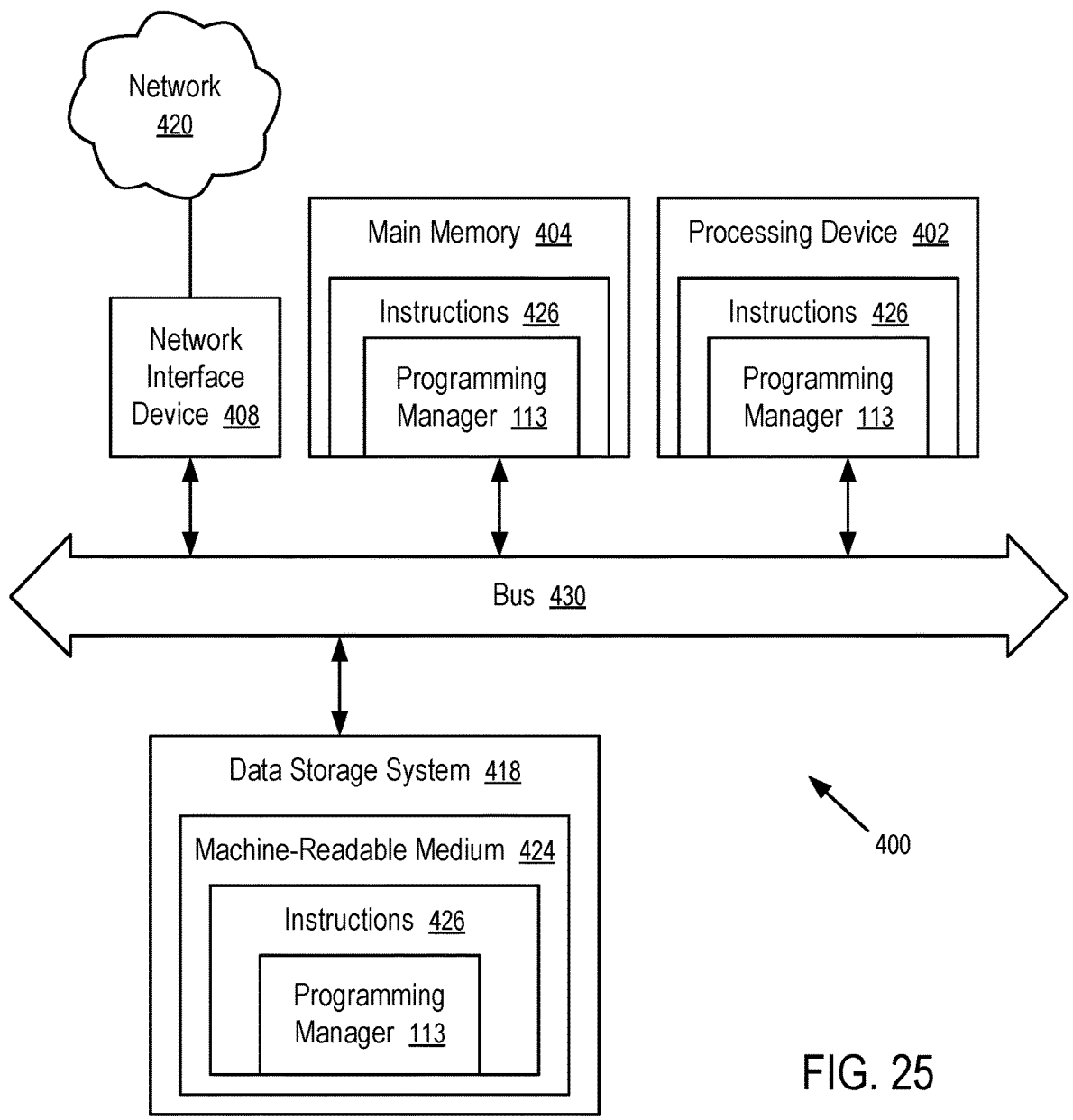
FIG. 25 is a block diagram of an example computer system in which embodiments of the present disclosure can operate.

FIG. 25 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a programming manager 113 (e.g., to execute instructions to perform operations corresponding to the programming manager 113 described with reference to FIGS. 1-24). In alternative embodiments, the machine can be connected (e.g., networked) to other machines in a LAN, an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant ($PD_A$), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable medium 424, data storage system 418, and/or main memory 404 can correspond to the memory sub-system 110 of FIG. 1.

In one embodiment, the instructions 426 include instructions to implement functionality corresponding to a programming manager 113 (e.g., the programming manager 113 described with reference to FIGS. 1-24). While the machine-readable medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   identifying a first wordline connected to a plurality of groups of first memory cells based on a determination that data bits represented by threshold voltages of the first memory cells and determined in a read operation have a bit error rate above a threshold;
   storing first data items as independent first codewords of an error correction code technique into a first portion of the first memory cells, wherein the first codewords have a same length;
   generating second data items as redundant information from the first codewords;
   storing the second data items in a second portion of the first memory cells; and
   in response to a determination that the bit error rate becomes lower than the threshold, storing third data items as independent second codewords of the same length in the first portion of the first memory cells and the second portion of the first memory cells.

2. The method of claim 1, wherein each of the second data item is generated from a subset of the first codewords.

3. The method of claim 2, wherein each of the second data item is generated from an XOR operation applied on the subset of the first codewords.

4. The method of claim 3, wherein at least a portion of the subset of the first codewords is distributed across different page types.

5. The method of claim 4, wherein at least a portion of the subset of the first codewords is distributed across different planes.

6. The method of claim 2, wherein each of the second data item is generated from an XNOR operation applied on the subset of the first codewords.

7. The method of claim 1, further comprising:
identifying a second wordline connected to a plurality of groups of second memory cells based on a determination that data bits represented by threshold voltages of the second memory cells and determined in a read operation have a bit error rate below the threshold; and
storing third data items as independent third codewords into the second memory cells, without generating redundant information from the third codewords for storing into the second memory cells, wherein the third codewords have the same length as the first codewords.

8. A memory sub-system, comprising:
a processing device; and
an integrated circuit die having a first wordline and a plurality of groups of first memory cells connected to the first wordline;
wherein in response to a determination that data bits represented by threshold voltages of the first memory cells and determined in a read operation have a bit error rate above a threshold, the processing device is configured to:
store first data items as independent first codewords of an error correction code technique into a first portion of the first memory cells, wherein the first codewords have a same length;
generate second data items as redundant information from the first codewords; and
store the second data items in a second portion of the first memory cells; and
wherein in response to a determination that the bit error rate becomes lower than the threshold, the processing device is configured to store third data items as independent second codewords of the same length in the first portion of the first memory cells and the second portion of the first memory cells.

9. The memory sub-system of claim 8, wherein each of the second data item is generated from a subset of the first codewords.

10. The memory sub-system of claim 9, wherein each of the second data item is generated from an XOR operation, or an XNOR operation, applied on the subset of the first codewords.

11. The memory sub-system of claim 10, wherein at least a portion of the subset of the first codewords is distributed across different page types.

12. The memory sub-system of claim 11, wherein at least a portion of the subset of the first codewords is distributed across different planes.

13. The memory sub-system of claim 8, wherein the integrated circuit die further has a second wordline and a plurality of groups of second memory cells connected to the second wordline; and in response to a determination that data bits represented by threshold voltages of the second memory cells and determined in a read operation have a bit error rate below the threshold, the processing device is further configured to store third data items as independent third codewords into the second memory cells, without generating redundant information from the third codewords for storing into the second memory cells, wherein the third codewords have the same length as the first codewords.

14. A non-transitory computer storage medium storing instructions which, when executed on a computing device, cause the computing device to perform a method, comprising:
identifying a first wordline connected to a plurality of groups of first memory cells based on a determination that data bits represented by threshold voltages of the first memory cells and determined in a read operation have a bit error rate above a threshold;
storing first data items as independent first codewords of an error correction code technique into a first portion of the first memory cells, wherein the first codewords have a same length;
generating second data items as redundant information from the first codewords;
storing the second data items in a second portion of the first memory cells; and
in response to a determination that the bit error rate becomes lower than the threshold, storing third data items as independent second codewords of the same length in the first portion of the first memory cells and the second portion of the first memory cells.

15. The non-transitory computer storage medium of claim 14, wherein each of the second data item is generated from a subset of the first codewords.

16. The non-transitory computer storage medium of claim 15, wherein each of the second data item is generated from an XOR operation applied on the subset of the first codewords.

17. The non-transitory computer storage medium of claim 16, wherein at least a portion of the subset of the first codewords is distributed across different page types.

18. The non-transitory computer storage medium of claim 17, wherein at least a portion of the subset of the first codewords is distributed across different planes.

19. The non-transitory computer storage medium of claim 15, wherein each of the second data item is generated from an XNOR operation applied on the subset of the first codewords.

20. The non-transitory computer storage medium of claim 14, wherein the method further comprises:
identifying a second wordline connected to a plurality of groups of second memory cells based on a determination that data bits represented by threshold voltages of the second memory cells and determined in a read operation have a bit error rate below the threshold; and
storing third data items as independent third codewords into the second memory cells, without generating redundant information from the third codewords for storing into the second memory cells, wherein the third codewords have the same length as the first codewords.

* * * * *